(12) United States Patent
Hristov

(10) Patent No.: US 8,786,554 B2
(45) Date of Patent: Jul. 22, 2014

(54) PRIORITY AND COMBINATION SUPPRESSION TECHNIQUES (PST/CST) FOR A CAPACITIVE KEYBOARD

(75) Inventor: Luben Hristov, Sofia (BG)

(73) Assignee: Atmel Corporation, San Jose, CA (US)

( * ) Notice: Subject to any disclaimer, the term of this patent is extended or adjusted under 35 U.S.C. 154(b) by 499 days.

(21) Appl. No.: 11/750,588

(22) Filed: May 18, 2007

(65) Prior Publication Data

US 2008/0007434 A1 Jan. 10, 2008

Related U.S. Application Data

(60) Provisional application No. 60/806,802, filed on Jul. 10, 2006.

(51) Int. Cl.
*G06F 3/041* (2006.01)
*H03M 11/00* (2006.01)

(52) U.S. Cl.
USPC .............................. 345/173; 341/22; 341/33

(58) Field of Classification Search
CPC ..................... G06F 3/044; G06F 2203/04104
USPC ................. 345/173–179; 341/21–33
See application file for complete search history.

(56) References Cited

U.S. PATENT DOCUMENTS

| 4,771,268 | A | | 9/1988 | Sone | |
|---|---|---|---|---|---|
| 5,730,165 | A | | 3/1998 | Philipp | |
| 5,734,928 | A | * | 3/1998 | Nakasuji | ........................ 710/67 |
| 5,748,512 | A | | 5/1998 | Vargas | |
| 6,259,436 | B1 | | 7/2001 | Moon | |
| 6,452,514 | B1 | | 9/2002 | Philipp | |
| 6,466,036 | B1 | | 10/2002 | Philipp | |
| 6,677,932 | B1 | | 1/2004 | Westerman | |
| 6,993,607 | B2 | * | 1/2006 | Philipp | ........................ 341/33 |
| 7,135,995 | B2 | * | 11/2006 | Engelmann et al. | ........... 341/22 |
| 7,230,607 | B2 | * | 6/2007 | Ono | .............................. 345/172 |
| 7,289,043 | B2 | * | 10/2007 | Takahashi | ....................... 341/22 |

(Continued)

FOREIGN PATENT DOCUMENTS

| CN | 1573661 A | 2/2005 |
|---|---|---|
| DE | 1970 02 225 C1 | 5/1998 |

(Continued)

OTHER PUBLICATIONS

PCT, International Search Report in PCT/IB2007/002534, mailed May 28, 2008.

(Continued)

*Primary Examiner* — Waseem Moorad
(74) *Attorney, Agent, or Firm* — Baker Botts LLP

(57) ABSTRACT

Apparatus and methods are described for selecting which of a plurality of simultaneously activated keys in a keyboard based on an array of capacitive sensors is a key intended for selection by a user. Combinations of keys which are commonly activated simultaneously when a user intends to select a single key are identified and associated with the single keys most likely to give rise to the identified combinations during normal use of the keyboard. In use, an observed combination of simultaneously activated keys is compared with predefined combinations of keys corresponding to those identified as being commonly activated simultaneously. If the combination of activated keys matches one of the predefined combinations, the most likely intended key associated with the matched one of the predefined combination of keys is taken to be most likely intended key.

22 Claims, 13 Drawing Sheets

(56) References Cited

U.S. PATENT DOCUMENTS

| | | |
|---|---|---|
| 7,289,073 B2 | 10/2007 | Song |
| 7,336,206 B2 | 2/2008 | Sugimura |
| 7,663,607 B2 | 2/2010 | Hotelling |
| 7,875,814 B2 | 1/2011 | Chen |
| 7,903,092 B2 | 3/2011 | Philipp |
| 7,920,129 B2 | 4/2011 | Hotelling |
| 8,031,094 B2 | 10/2011 | Hotelling |
| 8,031,174 B2 | 10/2011 | Hamblin |
| 8,040,326 B2 | 10/2011 | Hotelling |
| 8,049,732 B2 | 11/2011 | Hotelling |
| 8,179,381 B2 | 5/2012 | Frey |
| 2004/0140913 A1* | 7/2004 | Engelmann et al. ............ 341/22 |
| 2004/0169636 A1 | 9/2004 | Park et al. |
| 2004/0183833 A1 | 9/2004 | Chua |
| 2005/0246459 A1 | 11/2005 | Philipp |
| 2006/0192690 A1* | 8/2006 | Philipp ........................ 341/33 |
| 2006/0267805 A1* | 11/2006 | Glazkova et al. ............. 341/22 |
| 2007/0273561 A1* | 11/2007 | Philipp ........................ 341/33 |
| 2007/0287494 A1 | 12/2007 | You |
| 2009/0315854 A1 | 12/2009 | Matsuo |
| 2012/0242588 A1 | 9/2012 | Myers |
| 2012/0242592 A1 | 9/2012 | Rothkopf |
| 2012/0243151 A1 | 9/2012 | Lynch |
| 2012/0243719 A1 | 9/2012 | Franklin |
| 2013/0076612 A1 | 3/2013 | Myers |
| 2013/0241780 A1 | 9/2013 | Amm et al. |

FOREIGN PATENT DOCUMENTS

| | | |
|---|---|---|
| DE | 10344981 A1 | 5/2005 |
| EP | 1 381 160 A1 | 1/2004 |
| EP | 1426854 A | 6/2004 |
| EP | 1569079 A | 8/2005 |
| GB | 2274187 A | 7/1994 |
| GB | 2360740 A | 10/2001 |
| WO | 00/38041 A | 6/2000 |
| WO | WO 2012/129247 | 9/2012 |

OTHER PUBLICATIONS

"Chinese Application No. 200780025925.X, Office Action mailed Aug. 4, 2010" (w/ English Translation), 18 pgs.

"International Application Serial No. PCT/IB2007/002534, International Preliminary Report on Patentability mailed Nov. 13, 2008", 6 pgs.

"International Application Serial No. PCT/IB2007/002534, International Search Report mailed May 28, 2008", 3 pgs.

"International Application Serial No. PCT/IB2007/002534, Written Opinion mailed May 28, 2008", 5 pgs.

Office Action and English translation for Chinese Patent Application 200780025925.X, Jun. 29, 2011.

Office Action and English translation for Chinese Patent Application No. 200780025925.X, Apr. 23, 2012.

U.S. Appl. No. 61/454,936, filed Mar. 21, 2011, Myers.

U.S. Appl. No. 61/454,950, filed Mar. 21, 2011, Lynch.

U.S. Appl. No. 61/454,894, filed Mar. 21, 2011, Rothkopf.

Office Action and English translation for German Pat. Appln. 10 2007 024 4551.1, Feb. 17, 2010.

Office Action and English translation for German Pat. Appln. 10 2007 024 4551.1, Dec. 7, 2011.

UK Intellectual Property Office, Search and Exam Report re GB 0709905.4, Jul. 28, 2007.

Office Action from British Appln. 0709905.4, Jun. 9, 2009.

H. Philipp, U.S. Appl. No. 13/043,231, Non-final Office Action from USPTO, Dec. 19, 2012.

H. Philipp, U.S. Appl. No. 13/043,231, Response USPTO Non-final Office Action, Apr. 19, 2013.

H. Philipp, U.S. Appl. No. 13/043,231, Non-final Office Action from USPTO, Aug. 19, 2013.

H. Philipp, U.S. Appl. No. 13/043,231, Response USPTO Non-final Office Action, Nov. 5, 2013.

H. Philipp, U.S. Appl. No. 13/043,231, Final Office Action from USPTO, Nov. 21, 2013.

H. Philipp, U.S. Appl. No. 13/043,231, RCE with Amendment and IDS, Feb. 21, 2014.

H. Philipp, U.S. Appl. No. 11/750,430, Non-final Office Action from USPTO, Apr. 5, 2010.

H. Philipp, U.S. Appl. No. 11/750,430, Response USPTO Non-final Office Action, Aug. 4, 2010.

H. Philipp, U.S. Appl. No. 11/750,430, Notice of Allowance from USPTO Oct. 29, 2010.

* cited by examiner

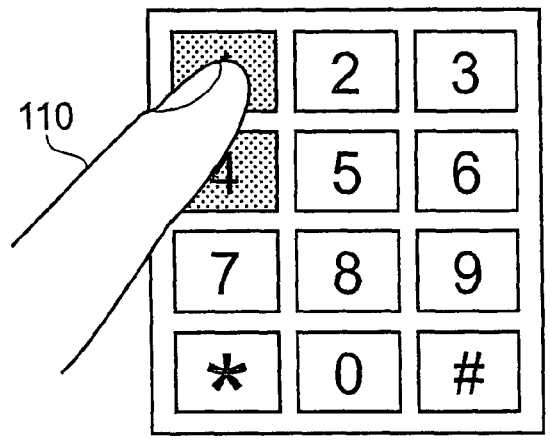
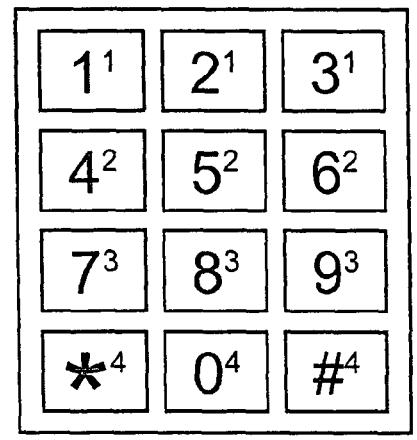
Fig. 2      Fig. 3
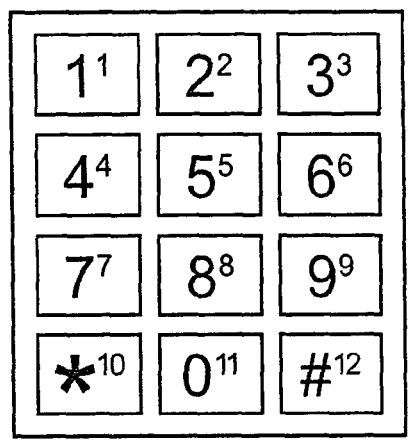
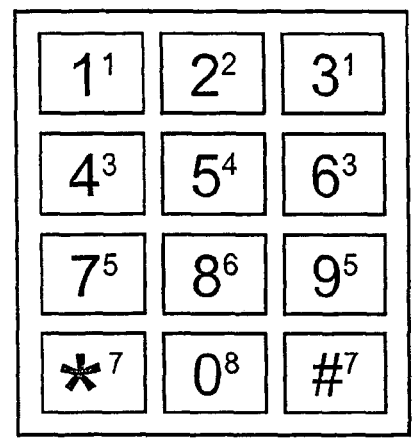
Fig. 4      Fig. 5

PRIORITY AND COMBINATION SUPPRESSION TECHNIQUES (PST/CST) FOR A CAPACITIVE KEYBOARD

BACKGROUND OF THE INVENTION

The invention relates to touch sensitive user interfaces having an array of sensing elements and methods for determining which of a plurality of sensing elements in simultaneous detection is intended by a user for selection. Thus the invention relates to a method and apparatus for controlling touch sensitive user interfaces, e.g. to assist in preventing accidental false inputs from keys adjacent to a selected key in a capacitive keyboard.

The use of capacitive proximity sensors, for example as keys in a keypad, is becoming more common. Capacitive sensors are frequently preferred to mechanical switches for a number of reasons. For example, capacitive sensors require no moving parts and so are less prone to wear than their mechanical counterparts. Capacitive sensors can also be made in relatively small sizes so that correspondingly small, and tightly packed keypad arrays can be provided. Furthermore, capacitive sensors can be provided beneath an environmentally sealed outer surface. This makes their use in wet environments, or where there is a danger of dirt or fluids entering a device being controlled attractive. Furthermore still, manufacturers often prefer to employ interfaces based on capacitive sensors in their products because such interfaces are often considered by users to be more aesthetically pleasing than conventional mechanical input mechanisms (e.g. push-buttons).

However, a drawback of interfaces based on arrays of capacitive sensors is that an object to be sensed, e.g. a user's pointing finger, will often be capacitively coupled to multiple capacitive sensors at the same time. This means that multiple capacitive sensors can appear to be activated simultaneously which can lead to an ambiguity as to which capacitive sensor in the array is intended for selection. This problem can be particularly apparent for sensors arranged into a closely packed array, e.g. in a keypad for a cellular telephone. With a small keypad such a this, a user's finger is likely to overlap multiple keys at the same time, i.e. both an intended key for selection, and also keys adjacent to it. This can be especially problematic if the user has large fingers, or if he presses on a panel over the sensors with enough force to deform his or her finger and so increase the effective area of his finger tip. The same sort of effect is found when a conducting film is spilled on a keyboard, in which case the user's finger is sensed as though it were the size of the puddle. Problems of this sort are particularly acute in cash register keyboards used in food service establishments where beverage and food sauce spills are a frequent occurrence. Another problem with capacitive keypads, known as the "handshadow" effect, arises because of the capacitive response to a body other than the pointing body, e.g., sensing the user's hand in addition to sensing his or her pointing finger.

U.S. Pat. No. 5,730,165 teaches a capacitive field sensor employing a single coupling plate and a method of detecting a change in capacitance of the coupling plate, $C_x$, to ground. The apparatus taught in U.S. Pat. No. 5,730,165 comprises pulse circuitry for charging the coupling plate and for subsequently transferring the charge from the plate into a charge detector, which may be a sampling capacitor, $C_s$. The transferring operation is carried out by means of a transfer switch electrically connected between the coupling plate and the charge detector. The disclosure of U.S. Pat. No. 5,730,165 is herein incorporated by reference.

U.S. Pat. No. 6,466,036 teaches pulse circuitry for measuring capacitance to ground, the circuitry comprising a plurality of electrical switching elements, each of which has one side electrically connected to either a power supply voltage or to a circuit ground point. This circuit arrangement, which may be used with a keyboard as well as for many other applications, is more compatible with available integrated circuit design and manufacturing practices than is prior art pulse circuitry, which commonly had one side of at least one switching element floating. These improved arrangements thereby provide superior performance at a lower manufacturing cost. The disclosure of U.S. Pat. No. 6,466,036 is herein incorporated by reference.

Attempts made to address the above-described problem of keying ambiguity with capacitive sensors are described in U.S. Pat. No. 6,993,607 and U.S. Ser. No. 11/402,269 (published as US 2006-0192690 A1). The disclosures of U.S. Pat. No. 6,993,607 and U.S. Ser. No. 11/279,402 are herein incorporated by reference.

U.S. Pat. No. 6,993,607 describes a method and apparatus for reducing keying ambiguity on a keyboard having an array of proximity sensors. The ambiguity is reduced by an iterative technique of repeatedly measuring a detected signal strength associated with each key in the array having respective output signals responsive to a degree of coupling between the key and a user, comparing all of the measured signal strengths to find a maximum, determining that the key having the maximum signal strength is the unique user-selected key, and maintaining the user selected key until the signal from that key falls below a threshold value. The signals from all the other keys are suppressed or ignored during the maintaining step.

U.S. Ser. No. 11/402,269 (published as US 2006-0192690 A1) describes an iterative method and apparatus for removing keying ambiguity on a keyboard by measuring a detected signal strength associated with each key in an array, comparing the measured signal strengths to find a maximum, determining that the key having the maximum signal strength is the unique user-selected first key, and maintaining that selection until either the first key's signal strength drops below some threshold level or a second key's signal strength exceeds the first key's signal strength. When any key is selected its signal strength value may be enhanced relative to all the other keys so as to deselect all other keys.

SUMMARY OF THE INVENTION

According to a first aspect of the invention there is provided a touch-sensitive user interface, comprising: a plurality of sensing areas; a measurement circuit coupled to the sensing areas and operable to generate output signals indicative of couplings between a pointing object and respective ones of the sensing areas; and a controller operable to receive the output signals from the measurement circuit, to determine from the output signals a combination of the sensing areas which are activated by the presence of the pointing object, to compare the combination of activated sensing areas with at least one predefined combination of the sensing areas, and to determine a selected one of the sensing areas according to a correspondence between the combination of activated sensing areas and a one of the at least one predefined combinations of sensing areas.

Thus sensing areas (keys) that are commonly activated simultaneously (i.e. together within the same measurement cycle) when a user intends to select only a single sensing area can be predefined as being associated with the most likely user intended sensing area that would give rise to the observed combination of activated sensing areas.

The touch-sensitive user interface may further be operable to output an output signal indicative of the sensing area determined to be the selected sensing area.

The user interface may be based on capacitive effects, i.e. such that the couplings between a pointing object and respective ones of the sensing areas are capacitive couplings. The user interface may alternatively be based on other coupling mechanisms, for example magnetic coupling.

The plurality of sensing areas might comprise between three and six sensing areas, for example four sensing areas. This has been found to be a suitable number for typical implementations of embodiments of the invention since a relatively small number of combinations can be defined to cover all likely combinations. This reduces processing required. A sensing region having a larger number of sensing areas may thus be considered as comprising a plurality of groups of smaller numbers of sensing areas.

The at least one predefined combination of activated sensing areas may, for example, include a combination of three sensing areas arranged along a line, and the selected one of the activated sensing for a combination of activated sensing areas corresponding to this predefined combination of activated sensing may be a middle one of the activated sensing areas. This can be useful because simultaneous activation of a line of three sensing areas when a user intends to select the middle one has been found by the inventors to arise commonly. This is particularly so where the line corresponds with a direction of approach and/or extent of a pointing object during normal use.

The at least one predefined combination of activated sensing areas may, for example, also include a combination of four sensing areas arranged in a line and the selected one of the activated sensing areas is adjacent to a sensing area at an end of the line of activated sensing areas. For example, the line may correspond with a direction of approach and/or extent of a pointing object during normal use, and the selected one of the activated sensing areas may be the second most distant activated sensing area along, and relative to, the direction of approach and/or extent of the pointing object during normal use. This can be useful because simultaneous activation of a line of four sensing areas when a user intends to select a sensing area second-from-the-end has also been found by the inventors to arise commonly.

The at least one predefined combination of activated sensing areas may comprise a contiguous series of neighboring sensing areas, e.g., because it is more likely that a object pointing will activate neighboring sensing areas that separated sensing areas.

If the comparison of the combination of activated sensing areas with the at least one predefined combination of sensing areas does not reveal a correspondence, the controller may be operable to determine a selected one of the activated sensing areas by taking account of the positions of the activated sensing areas within the sensing region. Thus a selected key can be reported when there is no match between the activated key(s) and any of the predefined combinations.

In other examples where the comparison of the combination of activated sensing areas with the at least one predefined combination of sensing areas does not reveal a correspondence (match) the controller may be operable to determine a selected one of the activated sensing areas by taking account of the output signals associated with the sensing areas.

The touch-sensitive user interface may further comprise a further plurality of sensing areas, and the measurement circuit may be coupled to the further plurality of sensing areas and be operable to generate further output signals indicative of couplings (e.g. capacitive or magnetic) between the pointing object and respective ones of the further sensing areas; and the controller may be operable to receive the further output signals from the measurement circuit, to determine a combination of the further sensing areas activated by the presence of the pointing object, to compare the combination of activated further sensing areas with at least one predefined combination of the further sensing areas, and to determine a further selected one of the sensing areas according to a correspondence between the combination of activated further sensing areas and the at least one predefined combinations of further sensing areas.

Thus an array of sensing areas may be considered as being notionally divided into two, or more than two, independent groups, and selected keys determined in broadly the same way for each group. The controller may then be operable to determine a selected one of the first-mentioned selected one of the sensing areas and the further selected one of the sensing areas. For example, the controller may be operable to determine a selected one of the first-mentioned selected one of the sensing areas and the further selected one of the further sensing areas by taking account of the positions of the respective selected sensing areas within the sensing region. Alternatively, the controller may be operable to determine a selected one of the first-mentioned selected one of the sensing areas and the further selected one of the further sensing areas by taking account of output signals associated with these sensing regions.

According to a second aspect of the invention there is provided an apparatus/device comprising a touch-sensitive user interface according to the fourth aspect of the invention. The apparatus/device, may, for example, be a cellular telephone, an oven, a grill, a washing machine, a tumble-dryer, a dish-washer, a microwave oven, a food blender, a bread maker, a drinks machine, a computer, an item of home audio-visual equipment, a portable media player, a PDA, and so on.

According to a third aspect of the invention there is provided a method for determining which of a plurality of sensing areas in a sensing region is selected by a pointing object, the method comprising: measuring a coupling (e.g. a capacitive coupling or a magnetic coupling) between the pointing object and respective ones of the sensing areas; determining from the measured couplings a combination of sensing areas activated by the presence of the pointing object, comparing the combination of activated sensing areas with at least one predefined combinations of sensing areas; and determining a selected one of the sensing areas according to a correspondence between the combination of activated sensing areas and a one of the at least one predefined combinations of sensing areas.

The method may further comprise outputting an output signal indicative of the sensing area determined to be the selected sensing area.

Although it is believed that the foregoing rather broad summary description may be of use to one who is skilled in the art and who wishes to learn how to practice the invention, it will be recognized that the foregoing recital is not intended to list all of the features and advantages. Those skilled in the art will appreciate that they may readily use both the underlying ideas and the specific embodiments disclosed in the following Detailed Description as a basis for designing other arrangements for carrying out the same purposes of the present invention and that such equivalent constructions are within the spirit and scope of the invention in its broadest form. Moreover, it may be noted that different embodiments of the invention may provide various combinations of the recited features and advantages of the invention, and that less than all of the recited features and advantages may be provided by some embodiments.

It will also be appreciated that features described above in connection with one aspect of the invention will often be equally applicable to, and may be combined with, other aspects of the invention.

BRIEF DESCRIPTION OF THE DRAWINGS

For a better understanding of the invention and to show how the same may be carried into effect reference is now made by way of example to the accompanying drawings in which:

FIG. 2 schematically shows in plan view a sensing region portion of the UI shown in FIG. 1;

FIG. 3 schematically shows a priority ranking scheme for keys of the keypad shown in FIGS. 1 and 2 according to an embodiment of the invention;

FIGS. 4 and 5 schematically show priority ranking schemes for keys of the keypad shown in FIGS. 1 and 2 according to other embodiments of the invention;

DETAILED DESCRIPTION OF A PREFERRED EMBODIMENT

Figure 1:
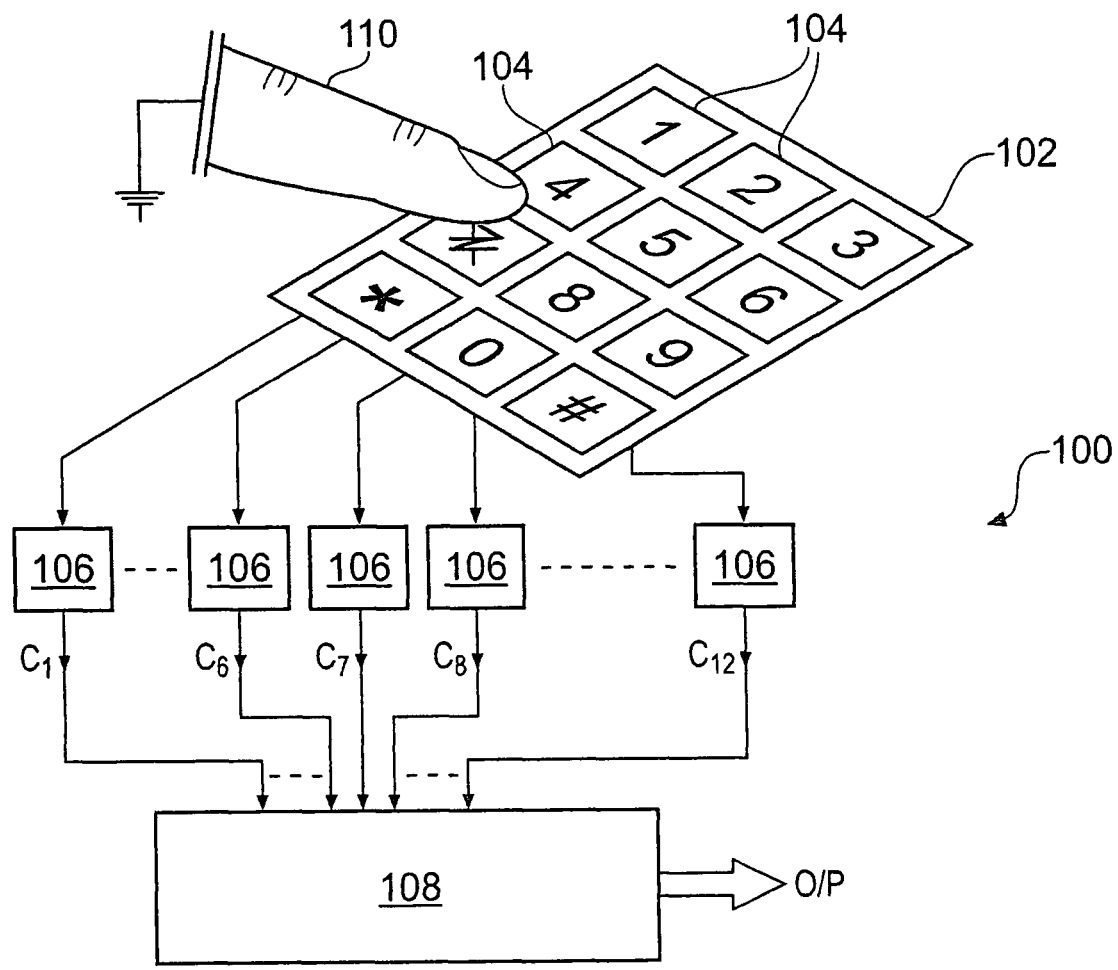
FIG. 1 schematically shows in perspective view a touch sensitive user interface (UI) according to an embodiment of the invention.

FIG. 1 schematically shows in perspective view a touch sensitive user interface (UI) 100 according to an embodiment of the invention. The UI comprises a sensing region 102 having an array of discrete capacitive sensing areas 104. In this example there are twelve sensing areas arranged in a three-by-four array. The sensing region 102 may conveniently be referred to as a keyboard or keypad and the sensing areas 104 may conveniently be referred to as keys. Also shown in FIG. 1 is a pointing object 110, in this case a user's finger, approaching the keypad to select one of the keys.

The keypad 102 may be of conventional design. In this embodiment the keypad is formed of a plastic substrate having discrete areas of conductive material deposited on the underside thereof to provide sensing electrodes. The shapes and locations of the electrodes define the shapes and locations of the corresponding sensing areas of the keyboard/keypad.

The sensing electrodes are coupled to respective ones of a plurality of capacitance measurement channels 106 in a capacitance measurement circuit. The capacitance measurement channels are for measuring the capacitive coupling of the associated electrodes to a system reference (ground) potential, and generating corresponding output signals $C_{1-12}$ indicative of the measured capacitances. The capacitance measurement channels may be of any known kind. For example circuitry based on RC circuits, relaxation oscillators, phase shift measurements, phase locked loop circuitry, or capacitive divider circuitry may be used. In this example the capacitance measurement channels are based on charge transfer techniques, such as those described in U.S. Pat. No. 5,730,165 or U.S. Pat. No. 6,466,036. Here separate capacitance measurement channels are provided for each key in the keypad. However, in other embodiments fewer capacitance measurement channels, e.g. a single channel, may be used with appropriate multiplexing.

The UI 100 further includes a controller 108. The controller is for receiving the output signals $C_{1-12}$ from the capacitance measurement channels and determining from the received output signals which (if any) of the keys is selected by a user, and outputting a corresponding key-selection output signal O/P. The key-selection output signal O/P may then be passed to and acted upon as appropriate by a main controller of the device associated with the UI in the normal way. The controller functionality may be provided by a suitably programmed general purpose processor, for example, or by means of special purpose hardware. For example the controller 108 may comprise a suitably configured application specific integrated circuit (ASIC), a field programmable gate array (FGPA), or an arrangement of discrete components.

The keypad in this example corresponds in layout with that of a typical telephone. Thus the twelve sensing areas (keys) 104 are respectively associated with the numbers 0 to 9, and the symbols * (star) and # (hash), as indicated in the figure. The sensing region is overlain with graphic decals to indicate to a user the shape and location of the underlying electrodes which define the sensitive areas of the keys, and also their associated functions. To select a desired key, a user moves his finger towards the appropriate part of the sensing area (as indicated to him by the graphic decal overlay), so that his finger is brought into proximity with the corresponding electrode. This act of selecting a key will sometimes be referred to as "pressing" a key. However, it will be understood that the term is used for convenience, and should not be interpreted as necessarily implying any form of physical contact between the pointing object and the selected sensing area.

In FIG. 1, the user is shown selecting the key associated with the number 7. The proximity of the user's finger to the electrode associated with number 7 increases the capacitive coupling of the electrode to ground. This leads to a change in the output signal from the associated capacitance measurement channel. Depending on the nature of the capacitance measurement channels used, an increase in capacitive coupling may lead to either an increase in output signal (direct relationship) or a decrease in output signal (inverse relationship). For simplicity, and unless the context demands otherwise, references to an increased output signal should be read throughout this description as meaning a change in the output signal which indicates an increase in the measured capacitive coupling of the associated electrode to ground, irrespective of whether there is a direct or an inverse relationship between the measured capacitance and the output signal (i.e. irrespective of whether parameterization of the output signal employed by the type of capacitance measurement channel goes up or down in response to an increase in measured capacitance). The controller is operable to determine if the characteristics of an increase in measured capacitance (e.g. magnitude, duration) are such that the key should be deemed to be in an activated state. This can be done according to conventional techniques, for example by requiring a predefined activation output signal level to be exceeded, and furthermore may employ techniques such as thresholding, drift compensation, filtering etc.

Thus, referring to FIG. 1, the proximity of the user's finger to the desired key, here key "7", increases the output signal $C_7$ associated with the key by an amount that leads the controller to determine that key "7" is activated (e.g. because the output signal has remained changed by a large enough amount for a long enough period). However, as noted above, it will generally be the case that the presence of the user's finger 110 adjacent to the sensitive area of the desired key "7" will also cause an increase in the capacitive coupling to ground of neighboring keys within the sensing region due to the proximity of the user's finger to these keys also. What is more, the increase in output signal associated with the keys not intended for selection may be sufficient for the controller to determine that the output signals from these keys also meet the requirements for being considered activated. Thus for the case shown in FIG. 1, the output signals associated with keys "4", "5", "8", "0", and "*" might also show significant increases in response to the approach of the user's finger, and may thus appear to be activated. The "*" key is likely to be most significantly effected because in addition to the user's finger tip being near to this key, the main body of the user's finger is also located over it (handshadow). Because of this the "*" key may even show a greater change in output signal than key "7".

The following describes how the controller 108 for the UI shown in FIG. 1 is operable to determine which key is to be taken as being intended for selection by the user when multiple keys show a sufficient increase in output signal that they meet the requirements for being considered activated according to one embodiment of the invention.

A consideration in determining the most likely one of multiple simultaneously activated keys intended for selection by a user according to embodiments of the invention is the orientation of the sensing region (keypad) relative to the normal direction of approach of a pointing object during normal use. For simplicity, terms such as upper, lower, left, right, etc. are used here to describe the relative positions of keys in the sensing region according to an orientation in which a direction of extent of a pointing object, which will generally also correspond to an approach direction, is substantially parallel to a direction running from a lower part to an upper part of the keypad. Thus for a mobile (cellular) telephone keypad such as shown in FIG. 1, a user will normally select keys with his finger approaching from a direction substantially parallel to the columns and running from the row containing keys "*", "0" and "#" to the row containing keys "1", "2" and "3" (as schematically shown in FIG. 1). Thus the row containing keys "*", "0" and "#" may be referred to as a lowermost (bottom) row of the keypad, and the row containing keys "1", "2" and "3" may be referred to as an uppermost (top) row of the keypad. This terminology will be used notwithstanding the fact that the user may hold the telephone such that the plane of the keypad is arbitrary (e.g. horizontal). Similarly, the column containing keys "1", "4", "7" and "*" may be referred to as a leftmost column of the keypad, and the column containing keys "3", "6", "9" and "#" may be referred to as a rightmost column of the keypad.

FIG. 2 schematically shows in plan view the sensing region portion 102 of the UI shown in FIG. 1 with the user's finger 110 shown in a position in which he intends to select key "1". The user's finger is sufficiently close to the intended key "1" that the change in output signal $C_1$ associated with this key is such that the controller determines the key to be activated. This is schematically shown in the figure by shading of the key "1". The user's finger also increases the output signal from the other keys in the keypad, most notably keys "2", "5" and "4". Here it is assumed that key "4" is most significantly affected. This is because key "4" is located below the intended key, and so the direction of extent of the user's finger runs directly over this key (handshadow). It is thus assumed that key "4" is also deemed to meet the requirements for being considered activated. Key "4" is thus also shown shaded in the figure. Keys "2" and "5" are assumed in this case not to be sufficiently affected to be deemed activated and so are not shaded in FIG. 2. In this situation (at least for cases in which only one key may be determined as being selected at any one time) the controller needs to decide which of keys "1" and "4" is to be taken as being intended for selection by the user so that an appropriate key selection output signal O/P from the UI can be generated.

In a conventional touch sensitive user interface, the choice of which of keys "4" and "1" should be taken as being the user-selected key (i.e. the key intended for selection by the user) will typically be based on either the magnitude of the output signals associated with the two keys (i.e. the key displaying the greatest output signal is deemed to be the selected key), or based on timing (i.e. the key which becomes activated first is deemed to be the selected key). However, both of these approaches can readily lead to incorrect determinations. For example, although in FIG. 2 the user intends to select key "1", the change in output signal $C_4$ associated with key "4" might in fact be larger. This could be due to the additional capacitive coupling provided by the main body of the user's finger to ground (handshadow), or simply because key "4" is more sensitive than key "1". Touch sensitive keys in an array will in general have differing sensitivities. Differences in sensitivity can be caused both by manufacturing tolerances and environmental effects (e.g. one key might be nearer to a ground plane, which will tend to reduce its sensitivity). Furthermore, although the user intends to select key "1", the characteristics of the change in output signal $C_4$ associated with key "4" may be such that key "4" is deemed to be activated (goes into activation) first. E.g., because in selecting key "1" the user's finger first moves over key "4". Thus conventional key-selection schemes based on magnitude or timing can both readily lead to an incorrect determination of the intended key.

User interfaces according to embodiments of the invention overcome this problem by taking account of both the output signals from the keys in the keypad and their positions within the keypad when determining a user selected one of the sensing areas (i.e. the intended key). This may be achieved by preferentially selecting from the activated keys according to the position of the keys in the keypad, i.e. by assigning a priority to each key in the keypad according to its position, and preferentially selecting keys having higher priorities.

FIG. 3 schematically shows a priority ranking scheme for keys of the keypad shown in FIGS. 1 and 2 according to an embodiment of the invention. For each key the priority rank is shown as a superscript to the symbol associated with the key function. Thus all of the keys on the uppermost (top) row are assigned a priority rank 1. These are the highest priority keys, the keys being of equal priority to one another. The keys "4", "5 and "6" are all assigned priority rank 2. Keys "7", "8 and "9" are assigned priority rank 3. Finally the keys on the lowest row (relative to an approaching finger) are assigned the lowest priority rank 4.

In determining which of a plurality of keys deemed to be in simultaneous activation is to be taken as being the user intended key for selection, the controller is operable to take account of the relative priority ranking of the activated keys.

One way of doing this is in an absolute manner, e.g. in which the highest ranked key in activation is deemed to be the selected key (in the case of multiple selected keys of the same highest rank, the key having the highest rank and greatest output signal, or the key having the highest rank to have gone into activation first, may be selected, for example). Thus referring to FIGS. 2 and 3, keys "1" and "4" are in activation. Key "1" has a ranking of 1 and key 4 has a ranking of 2. Thus key "1" is deemed to be the user-intended key for selection because it is of higher priority (rank 1) than key "4" (rank 2).

Another way in which the controller may take account of the relative priority ranking for the activated keys is by output signal weighting to preferentially select keys at positions associated with higher rankings. Thus the controller may be arranged to apply a weighting to the output signals according to the positions of the corresponding keys in the sensing region. For example, a scale factor may be associated with each priority rank (i.e. so that each key is associated with a predefined scale factor) and keys associated with higher scale factors may be preferentially selected over keys having lower scale factors. For example, and again referring to FIGS. 2 and 3, a priority rank of 1 might be associated with a scale factor of 2, a priority rank of 2 might be associated with a scale factor of 1.5, a priority rank of 3 might be associated with a scale factor of 1.0, and a priority rank of 4 might be associated with a scale factor of 0.5. Thus for the case shown in FIG. 2, the output signals of the activated keys are scaled in accordance with their respective predefined scale factors. The key having the highest weighted output signal is then deemed to be the selected key. This has the advantage over the above-described absolute priority ranking scheme in that a lower ranked key can still be selected over a higher ranked key if its output signal is sufficiently high compared to that of the higher-ranked key (i.e. the lowest ranked keys are not too strongly blocked out from selection).

In some examples based on output signal weighting there may not be a step of first determining which keys are in activation. Instead the output signals from all keys may be scaled by their appropriate predefined scale factors and key having the greatest weighted output signal taken to be the selected key. (Possibly after first determining that the greatest weighted output signal meets predefined requirements for reporting a selection, such as magnitude and duration of signal, to avoid the controller reporting a selected key when the keypad is not in fact in use.)

FIG. 4 is similar to and will be understood from FIG. 3. However, FIG. 4 shows an alternative ranking scheme for the keys of the keypad shown in FIGS. 1 and 2. As with FIG. 3, for each key in FIG. 4 the priority rank is shown as a superscript to the symbol associated with the key function. The ranking scheme shown in FIG. 3 and described above may be most appropriate for a keypad for which in normal use a pointing object approaches from, and extends along, a direction which is substantially parallel with the columns of the keys. Thus keys in the same row are assigned equal priorities. However, for the ranking scheme shown in FIG. 4, the keys are assigned a priority ranking according primarily to their row, but also according to their column. Thus keys in the top row are ranked higher than keys in the next row down, which themselves are ranked higher than keys in the next row down, and so on. Furthermore, within each row, keys in the left column are ranked higher than keys in the centre column, and keys in the centre column are in turn ranked higher than keys in the right column. This ranking scheme may be more appropriate for a keypad for which in normal use a pointing object approaches from the lower right of the keypad (for the orientation shown in FIG. 4). This might be the case, for example, for a mobile telephone keypad with a predominantly right-handed user. E.g. the user may cradle the telephone in the palm of his right hand and use his thumb as a pointing object, or hold the telephone in his left hand and use his right forefinger as a pointing object. In both of these cases there is an increased risk that keys to the right of an intended key will have their output signals unduly increased by the user's thumb/fingertip being relatively near to them and the body of the thumb/finger passing over them. Thus keys towards the left-hand side of the keypad are assigned priority rankings (indicated by a higher numerical superscript in the figure) than keys towards the right-hand side of the keypad. (A left-right reversal of this ranking scheme may be better for a keypad to be used predominantly by a left-handed user. The UI may thus be configured to allow the user to select between ranking schemes).

FIG. 5 is similar to and will be understood from FIGS. 3 and 4. For the ranking scheme represented in FIG. 5, the keys are again assigned a priority ranking according primarily to their row, and as with FIG. 4 are also prioritized according to their column. However, the rankings according to column are different from those of FIG. 4. The row ranking is broadly the same in that keys in the top row are ranked higher than keys in the next row down, which themselves are ranked higher than keys in the next row down, and so on. However, within each row, keys in the left column and right column are ranked equal and higher than keys in the centre column. This ranking scheme may be preferred for a keypad for which in normal use a pointing object approaches from either the lower left or the lower right of the keypad (for the orientation shown in the figure). This might be the case, for example, for a mobile telephone keypad which may be used with either left-handed or right-handed users, or for a device held between the palms of both hands with both thumbs being used as pointing objects. The principle underlying the ranking scheme shown in FIG. 5 is that if a pointing object approaches from the right and intends to select key "4", key "5" is less likely to be wrongly reported as the selected key because it is suppressed by virtue of its lower ranking. Key "6", on the other hand, has the same ranking as key "4". However, key "6" will in general be less likely to be wrongly selected if a user intends to select key "4" because it will be further away from his finger tip and, so will be expected to display a significantly lower output signal (i.e. there is less chance of a non-immediate neighbor key being wrongly selected than for an immediate neighbor key. Thus it is not so significant that it has the same ranking). The same applies for a pointing object approaching from the left and intending to select key "6" (i.e. key "5" is suppressed by virtue of its lower ranking, and key "4" will be unlikely to be selected because of its greater distance from the user intended key "6").

As will be readily understood, the specific details of any given priority ranking scheme, e.g. the appropriate scale factors or absolute rankings for the different keys, will depend on the specific keyboard layout at hand, the relative sizes of the keys, the spacing between them relative to the size and shape of the pointing object, the normal orientation of the keyboard in use, and the nature of the pointing object, and the direction in which the pointing object normally moves towards and over the keyboard when selecting a key. The specific details of the ranking scheme can thus be determined experimentally by identifying which keys during normal use of a particular keyboard layout have a tendency to be wrongly selected when no ranking scheme being used, and providing these keys with an accordingly lower ranking to suppress them.

For example, consider a keyboard having 3 keys "A", "B" and "C". In an experiment the keys are equally ranked and a user presses each key 100 times in the manner expected during normal use (i.e. approaching the keypad with the normal pointing object from the normal-use direction). Because of the above-mentioned problems with determining a correct key selection it is assumed the controller wrongly determines that key "A" is selected 150 times, key "B" 100 times, and key "C" 50 times. In view of these statistics, the keys may thus be ranked so that the output signal from key "A" is scaled by factor of two-thirds, the output signal from key "B" is scaled by factor of unity, and the output signal from key "C" is scaled by factor of two, for example.

Figure 6:
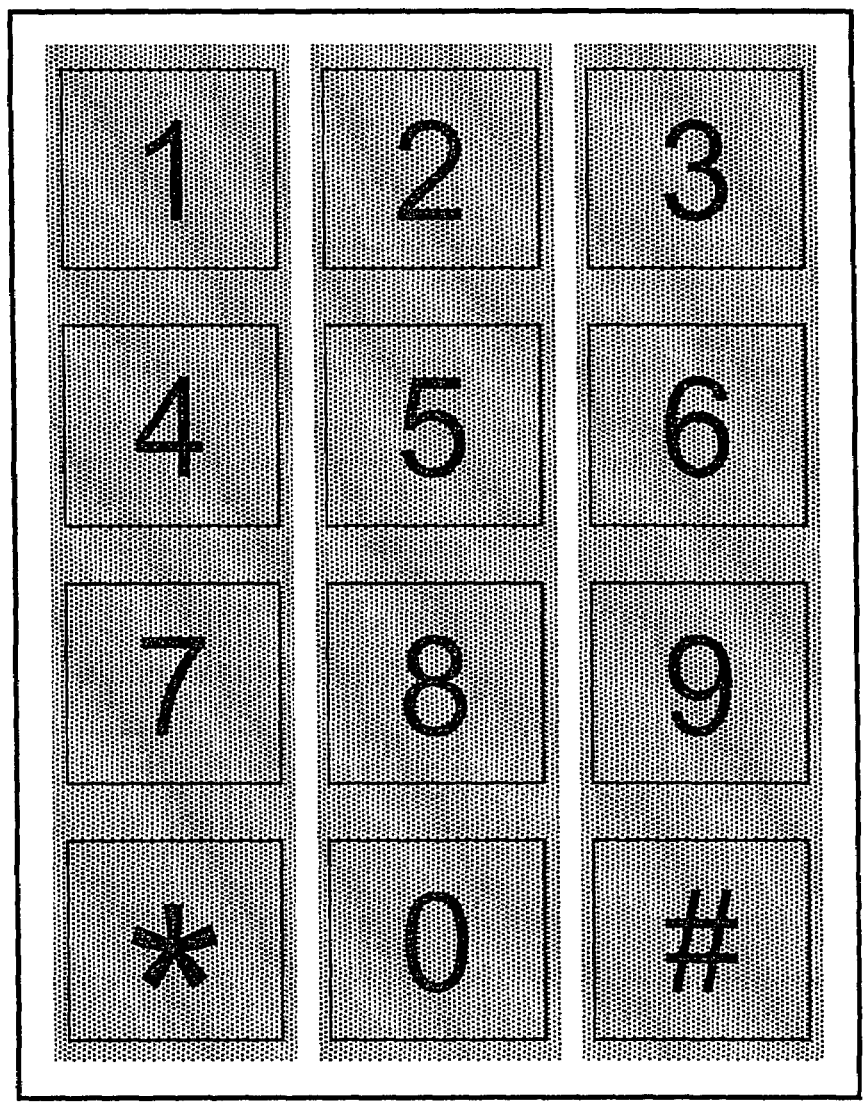
FIG. 6 schematically shows in plan view a sensing region portion of the UI shown in FIG. 1 with shading used to indicate three separate key groupings.

FIG. 6 schematically shows in plan view the sensing region portion of the UI shown in FIG. 2. FIG. 6 is thus similar to and will be understood from FIG. 2. However, portions of the UI shown in FIG. 6 are overlain with shading to represent some predefined key groupings (in this case three) which may be used in embodiments of the invention. The key groupings shown by the shading do not mean that the grouped keys share any particular characteristics which are different from keys in other groups, rather the groupings are notional and merely represent collections of keys which may be considered together and independently of other keys for some aspects of the process of determining a selected key according to some embodiments of the invention. As indicated in FIG. 6, keys "1", "4", "7" and "*" collectively form a first group of keys, keys "2", "5", "8" and "0" collectively form a second group of keys, and keys "3", "6", "9" and "#" collectively form a third group of keys. The inventors have found that improved reliability in key selection can be obtained if the process of determining a user intended key is performed in two stages. In a first stage the most likely key within each of the predefined groups is determined, for example, using the principles described above whereby keys are preferentially selected according to their position within the group, and in a second stage, the overall most-likely key of the most-likely keys from each group is determined.

For example, with reference to FIG. 6, the controller first considers only the output signals from keys within the first group (i.e. keys "1", "4", "7" and "*"), and determines which key within that group is to be deemed to be the selected key for that group (independently of the output signals from keys in the other groups). This may be considered an intermediate selected key. This is because although the key is selected from among the keys within the group, it may not be the finally determined user-selected key from the keypad as a whole since this may come from another group. The selection of the intermediate selected key from each group may be done by taking account of the output signals and the positions of the keys within the sensing region using any of the methods described above. In effect, in this stage the group of keys "1", "4", "7" and "*" is considered as a self-contained sensing region containing only four keys which is independent of other keys. The controller then does the same for the other two groupings. These two groupings are also in effect self-contained sensing regions. (It will be understood that the three key-groupings could equally be considered in a different order or in parallel.) Thus with this approach the UI may be considered as three separate and independent sensing regions. The result is therefore three independently selected (intermediate) keys, one from each group. (It is assumed here that there is at least one key in each group having output signal characteristics to meet the requirements for being considered in activation. However, in many cases it may be that there is no key within a group that can be considered in activation and thus a null-result (no key deemed selected) may be determined for that particular grouping of keys.)

The next stage is to determine which of the three intermediate independently selected keys is to be determined as the sole user-selected key. This may be done in a number of ways, for example, based on known techniques for selecting between multiple keys (e.g. greatest output signal, first to go into activation, etc.). Alternatively, the selection may be made in a manner similar to the scheme used to select the keys from within the separate groupings (i.e. by taking account of the positions of the keys selected in the first stage within the UI as a whole, possibly with the keys having different priority rankings in this stage compared to the first stage).

The above-described schemes for determining an intended user selected key by taking account of both the output signals associated with keys (sensing areas) and their positions within the sensing region may be referred to as position dependent suppression (PDS) schemes (because keys are suppressed (or other keys enhanced) according to their positions). PDS schemes have been found to work well regardless of how many keys are activated simultaneously. However, the inventors have also found that an alternative technique, referred to here as combination key suppression (CKS), can sometimes be more helpful when three or more keys are simultaneously determined to be in detection/activation. CKS techniques can also be helpful when used in combination with PDS techniques, e.g. by applying them in series as described further below.

CKS techniques can be applied to the same user interface as shown in FIG. 1, but with the controller configured differently so as to implement the CKS scheme. Embodiments of the CKS scheme are based on first determining which combination of keys within a predefined set/group of keys (which may be the whole or only a subset of a keyboard/keypad) are in detection for a given measurement acquisition/cycle. This can be done in any known manner, e.g. as determined from the characteristics of the key output signals. Once the keys in detection have been identified, it is determined whether the particular combination of activated keys matches any of a plurality of predefined combinations, and if so, a key previously associated with the matched predefined combination is taken to be a selected key for the group of keys under consideration. If the combination of keys in detection does not match any of the predefined combinations, alternative techniques, such as the PDS technique described above, or any conventional technique, may be used instead to determine a selected key from those in detection.

As noted above, the set of keys to which the CKS scheme can be applied may correspond with the whole of a keypad, or only a subset of the keys of the keypad. In the latter case the subset may be considered independently of the other keys. In general, the CKS scheme has been found to work well when applied to a set of around four to six or so keys. Thus for a conventional telephone keypad comprising twelve keys, three independent sets of four keys may be defined and considered separately from one another. Thus in an embodiment of the CKS scheme applied to a telephone keypad of the kind shown in FIG. 1, the keypad may be considered as being notionally divided into three groups of four keys as indicated in FIG. 6. The CKS scheme may then be applied independently to each of the first group/set of keys ("1", "4", "7" and "*"), the second group/set of keys ("2", "5", "8" and "0"), and the third group/set of keys ("3", "6", "9" and "#"). The groups will normally be defined such that each group contains sets of keys that are likely to be activated when another key within the same group is intended for selection by a user. Thus the groups will normally comprise neighboring keys arranged along a direction associated with a direction of extent/approach of a pointing object in normal use.

Figure 7A:
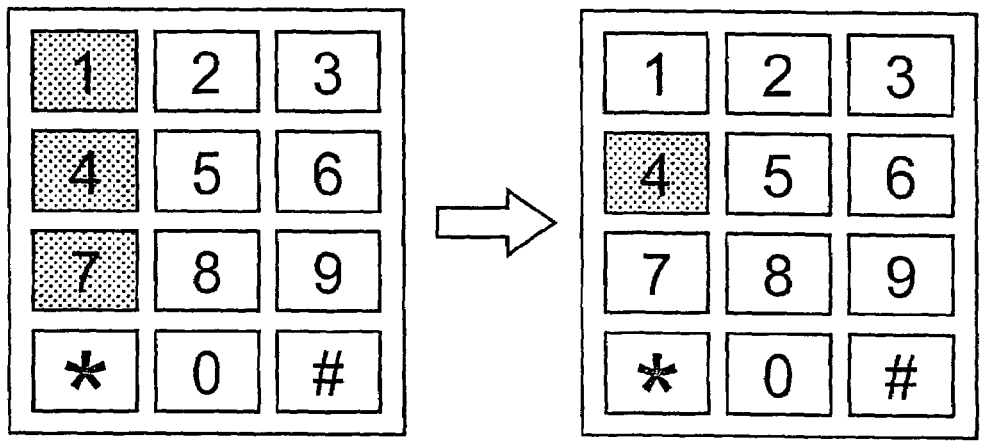
FIGS. 7A-7C schematically show a series of pre-defined key combinations and corresponding deemed user-selected keys from within the group of keys in the left-hand column of keys in the UI shown in FIG. 6.
Figure 7B:
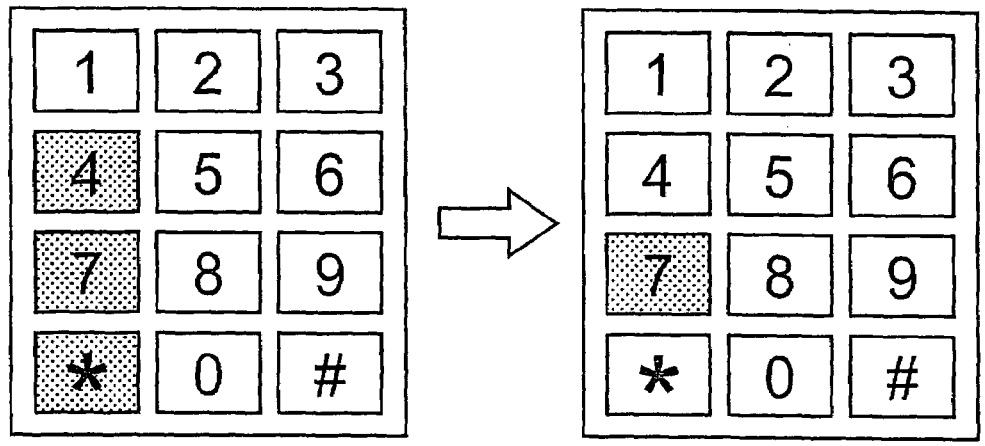
Figure 7C:
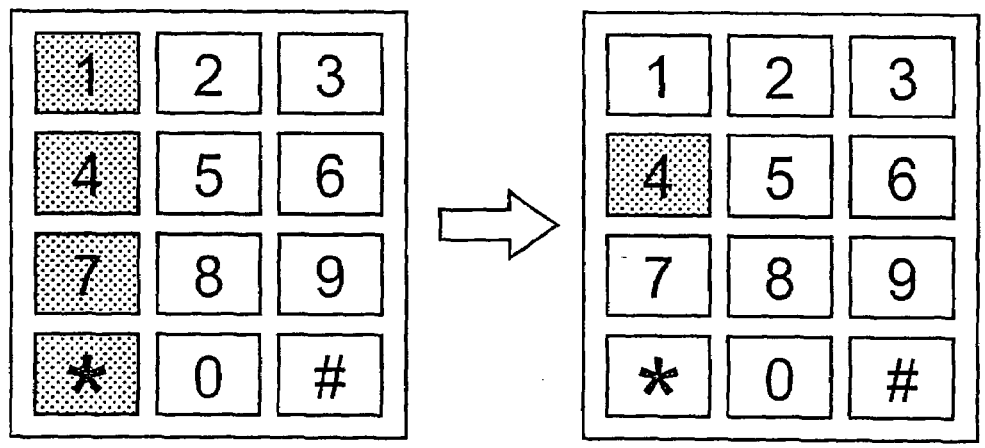

FIGS. 7A to 7C schematically show three different predefined key combinations associated with the first group of keys of the keypad shown in FIG. 6 (i.e. for keys "1", "4", "7" and "*"). For each predefined combination of keys a corresponding predefined selected key is also shown. The predefined selected key is a key deemed to be the user intended key from with the group which gave rise to the combination of activated keys. The predefined combinations of keys are shown using shading in the left-hand representation of the keypad in each of the figures. The corresponding selected key deemed to be the user intended key for the combination is shown by shading in the right-hand representation of the keypad. It will be appreciated that the term "user intended" and variations thereof are sometimes used here for convenience to refer to the key that will be deemed a selected key from those in detection within a given group of keys (i.e. an intermediate selected key). Where the group of keys under consideration is a subset of a keypad (such as shown in FIG. 6), it will be understood the key referred to as the user intended key for a group may not be the key eventually determined to the key the user wants to select from the keypad as a whole, because this key might be in a different group.

Thus the left-hand of FIG. 7A shows a first predefined combination of keys corresponding to keys "1", "4" and "7" in detection and key "*" not in detection. The right-hand of FIG. 7A shows that key "4" is deemed to be the selected key corresponding to this combination. That is to say, if when the UI is in use keys "1", "4" and "7" are determined to be in detection, while key "*" is not in detection, the controller of the user interface is operable to match the observed combination of activated keys ("1", "4" and "7") with the predefined combination of keys shown in FIG. 7A, and thus to determine that key "4" (which is predefined as corresponding to this combination as shown in the right-hand side of FIG. 7A) is to be taken to be the intermediate user-selected key from within this combination.

Similarly, FIG. 7B (left-hand side) shows a second predefined combination of keys corresponding to keys "4", "7" and "*" in detection and key "1" not in detection. The right-hand side of FIG. 7B shows that key "7" is predefined as the key deemed to be the selected key corresponding to this combination.

Finally, FIG. 7C shows a third predefined combination of activated keys. In this combination all the keys of the first group of keys are in detection. The right-hand side of FIG. 7C shows this combination of keys is deemed to correspond to key "4" being the user selected key.

In this example implementation of the CKS scheme there are no other predefined combinations of keys for the first group of keys (i.e. there are no predefined combinations of keys having less than three keys in detection, or combinations of three keys which are not contiguous).

Figure 8A:
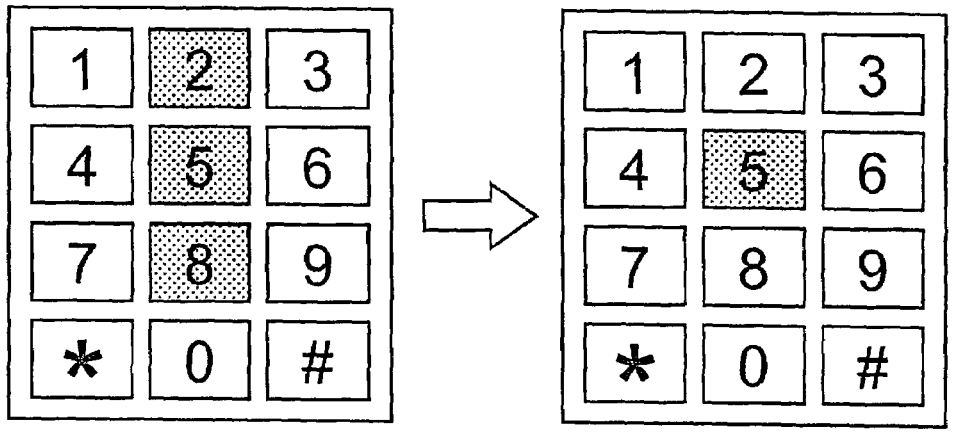
FIGS. 8A-8C schematically show a series of pre-defined key combinations and corresponding deemed user-selected keys from within the group of keys in the middle column of keys in the UI shown in FIG. 6.
Figure 8B:
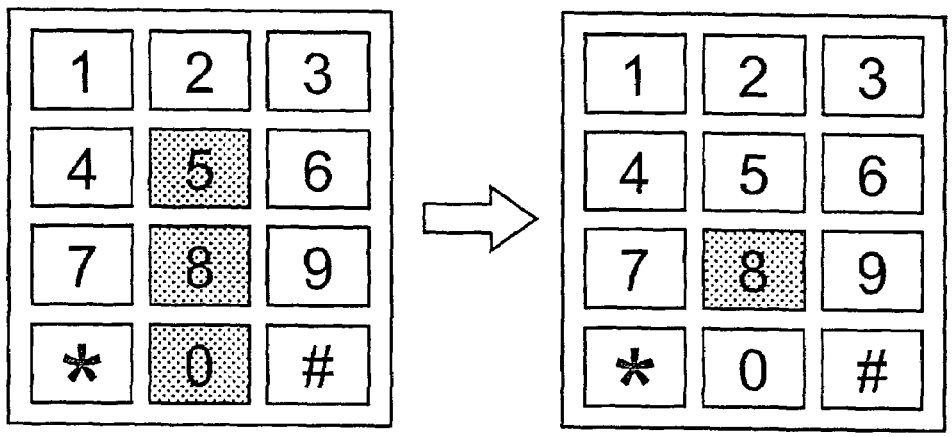
Figure 8C:
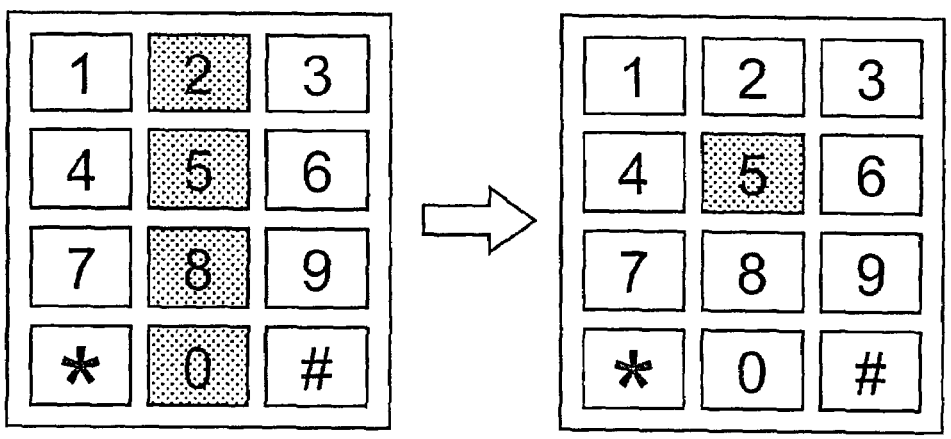

FIGS. 8A to 8C schematically show three different predefined key combinations associated with the second group of keys of the keypad shown in FIG. 6 (i.e. keys "2", "5", "8" and "0"). Again, for each predefined combination of keys a corresponding selected key deemed to be the user intended key for that combination is also shown. As with FIGS. 7A to 7C, the predefined combinations are shown by shading on the left-hand representations of the keypad and the corresponding deemed selected key for each combination is shown by shading on the right-hand representations. Apart from being shifted across one column, the key combinations and corresponding deemed selected keys within the second group of keys (i.e. those in the middle column of the keypad) follow those within the first group of keys (those in the left-hand column of the keypad).

Thus FIG. 8A shows a predefined combination of keys corresponding to keys "2", "5" and "8" in detection and key "0" not in detection as corresponding to key "5" being taken to be the selected key. FIG. 8B shows a predefined combination of keys corresponding to keys "5", "8" and "0" in detection and key "2" not in detection as corresponding to key "8" being taken to be the selected key. FIG. 8C shows a predefined combination of keys corresponding to keys "2", "5", "8" and "0" in detection (i.e. all keys in group activated) as corresponding to key "5" being taken to be the selected key from among those in the group. As with the first group, for this implementation of the CKS scheme there are no other predefined combinations of keys.

Figure 9A:
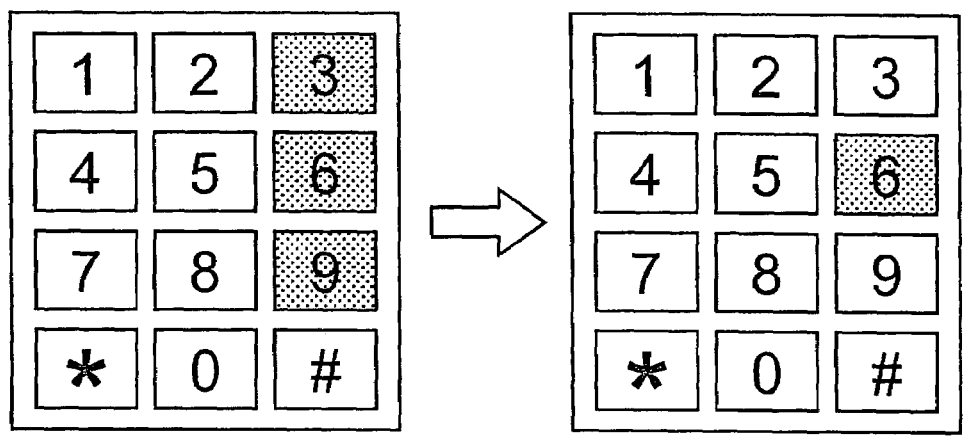
FIGS. 9A-9C schematically show a series of pre-defined key combinations and corresponding deemed user-selected keys from within the group of keys in the right-hand column of keys in the user interface shown in FIG. 6.
Figure 9B:
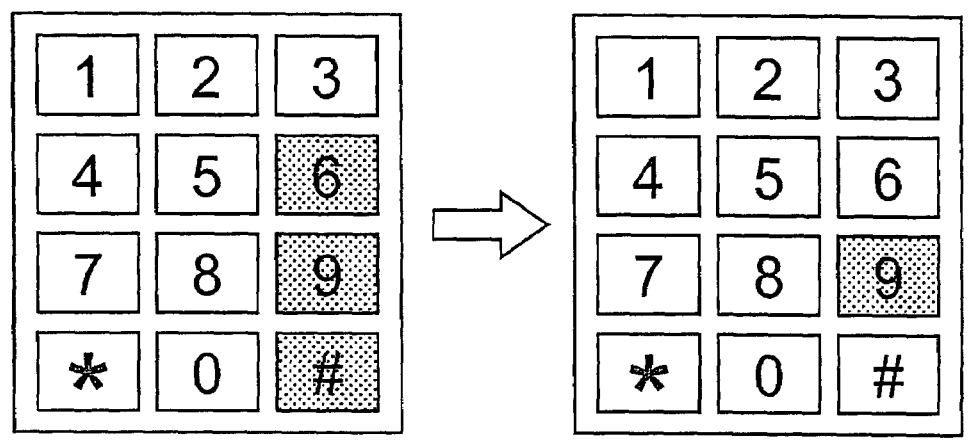
Figure 9C:
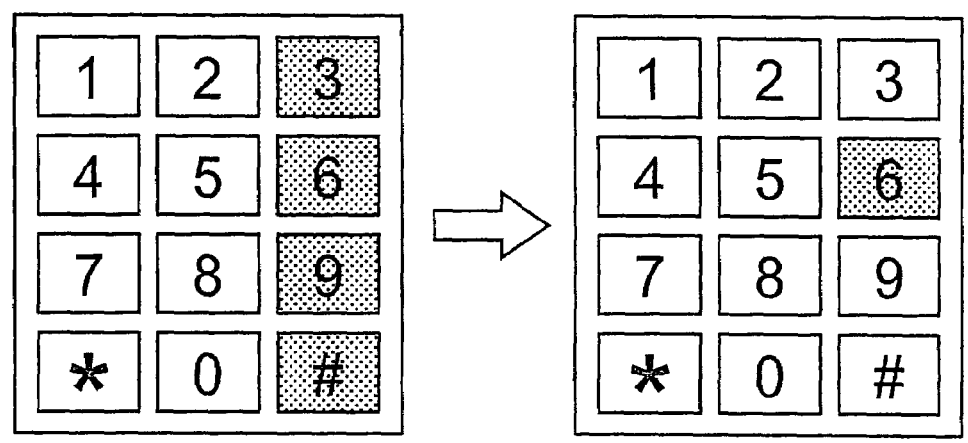

FIGS. 9A to 9C schematically show three different predefined key combinations associated with the third group of keys of the keypad shown in FIG. 6 (i.e. keys "3", "6", "9" and "#"). Again for each predefined combination of keys a corresponding selected key deemed to be the user intended key for that combination is also shown. As with FIGS. 7A to 7C, the predefined combinations are again shown by shading on the left-hand representations of the keypad and the corresponding deemed selected key for each combination is shown using shading on the right-hand representations. The key combinations and corresponding deemed selected keys within the third group of keys (i.e. those in the right-hand column of the keypad) again match those within the first and second groups of keys.

Thus FIG. 9A shows a predefined combination of keys corresponding to keys "3", "6" and "9" in detection and key "#" not in detection as corresponding to key "6" being taken to be the selected key. FIG. 9B shows a predefined combination of keys corresponding to keys "6", "9" and "#" in detection and key "3" not in detection as corresponding to key "9"

being taken to be the selected key. FIG. 9C shows a predefined combination of keys corresponding to keys "3", "6", "9" and "#" in detection (i.e. all keys in group activated) as corresponding to key "6" being taken to be the selected key. As with the first and second groups, for this implementation of the CKS scheme there are no other predefined combinations of keys for the third group.

Appropriate predefined key combinations and the corresponding predefined deemed selected keys for the combinations will depend on the nature of the keypad at hand, e.g. the specific keyboard layout, the relative sizes of the keys, the spacing between them and the size and shape of the pointing object, the normal orientation of the keyboard in use, the nature of the pointing object, and the directions from which the pointing object approaches the keypad and along which it extends in normal use. Thus appropriate predefined key combinations and corresponding predefined deemed selected keys for the combinations for a given keypad may be determined empirically.

For example, and referring to a keypad generally of the type shown in FIG. 1, an experiment may be performed whereby a user randomly or systematically selects keys in one of the groups into which the keyboard is notionally divided. E.g. in this case it will be assumed the experiment is performed to determine appropriate key combinations for the first group of keys (keys "1", "4", "7" and "*"). Thus the user indicates an intended key within this group in the manner expected during normal use (i.e. by approaching the keypad with the usual pointing object (e.g. finger), from the normal-use direction, and with the keypad in the normal use orientation, and with the level of precision/user attention expected during normal use). Around 400 or so key selections might be made, e.g., around 100 key selections per key in the group. For each key selection made during the experiment a recording is made of which keys within the group were determined to be activated (i.e. in detection) as a result of the key selection. In some cases keys in other groups, e.g. keys in the middle column, may also go into detection, but these may be ignored since in this example keys in the first group are considered independently of other keys. The results of the experiment may then be analyzed to determine appropriate predefined key combinations and their corresponding deemed selected keys, for example, as follows.

It is assumed for this embodiment that CKS techniques are only to be applied to resolve multiple key activations when more than two keys in a group are in simultaneous detection (other techniques may be used where two keys or fewer in a group are in simultaneous detection, e.g. PDS techniques such as described below with reference to FIGS. 10A and 10B). Thus any of the experimental key selections which did not result in three keys within the group going into detection are discarded from the analysis. Next an analysis is made of the remaining experimental data to determine which combinations of three or more keys in the group occur a significant number of times, e.g. on more than 5% of the occasions that three or more keys are determined to be activated in response to the key selection.

Some key combinations are less likely to arise. For example, for a single pointing object such as a finger, it is unlikely that keys "1", "7" and "*" would be in detection while key "4" was not. Thus this combination would not be expected to arise a significant number of times (if any). This is because in general one would normally (but not necessarily exclusively) expect only combinations of contiguously adjacent keys to be simultaneously in detection. The reason for not using all possible combinations, i.e. the reason for excluding rare combinations, is to reduce the amount of processing required during normal use of the UI. Processing is reduced because the number of predefined key combinations needing to be considered is reduced. (In other cases all possible combinations of keys may be included as predefined combinations having associated deemed selected keys.) In the present case it is assumed that only three combinations of three or more keys occur a significant number of times during the experiment. These are a first combination of keys "1", "4" and "7" (as shown in FIG. 7A), a second combination of keys "4", "7" and "*" (as shown in FIG. 7B), and a third combination of all keys within the group (as shown in FIG. 7C). These combinations are thus the only predefined combinations to be used for the first group keys.

For each of these predefined combinations, an analysis is then made to determine which of the individual keys was most often the intended key for selection when the particular key combination arose. This is the taken to be the intended user selected key corresponding to that combination. For example, assume a combination of keys "1", "4" and "7" in detection arose 20 times during the experiment, and that on 20% of these occasions the intended key for selection had been key "1", on 5% of occasions the intended key had been key "7", and on the remaining 75% of occasions the intended key had been key "4". In this case key "4" would be defined as being the most-likely intended key for selection, as indicated in the right-hand FIG. 7A. Simiarly it is assumed here that it is found the most frequent intended key when the combination of keys "4", "7" and "*" are in detection, and key "1" not in detection, is key "7" (as shown in FIG. 7B), and the most frequent intended key when the all keys in the group are in detection is key "4" (as shown in FIG. 7C).

A similar analysis of the second and third notional key groupings shown in FIG. 6 may be made, and are assumed for the keypad layout in this example to lead to the relationships schematically shown in FIGS. 8A-C and 9A-C.

Thus, using this type of experimental approach it is possible to determine appropriate predefined key combinations and corresponding deemed selected keys for use in embodiments of the CKS scheme for any particular keypad layout and notional key grouping. It will be appreciated that this process of determining appropriate predefined key combinations and corresponding deemed selected keys will in general need only be performed once at a design stage for a given keypad layout. (And indeed possibly only for one of the notionally defined group in the event the groups are of similar layouts and orientations with respect to the pointing object, such as in FIG. 6.) The same predefined combinations and associated deemed selected keys may then be used for all keypads manufactured to the same or similar design. E.g. the predefined combinations shown in FIGS. 7 to 9 may be used for all keypads having a layout conforming to that of a conventional telephone keypad or similar (e.g. any similar array of keys whether used as a numeric keypad or otherwise). It would not in general be necessary to redetermine appropriate predefined key combinations and corresponding deemed selected keys for each individual keypad once it had been done once for the design as a whole. In other cases, a UI may include a learning mode whereby an end user performs the above described experiment himself to determine predefined key combinations and corresponding deemed selected keys which are appropriate for his personal style of using the keyboard (i.e. from what direction he approaches the keyboard and what he uses as a pointing object).

Figure 10A:
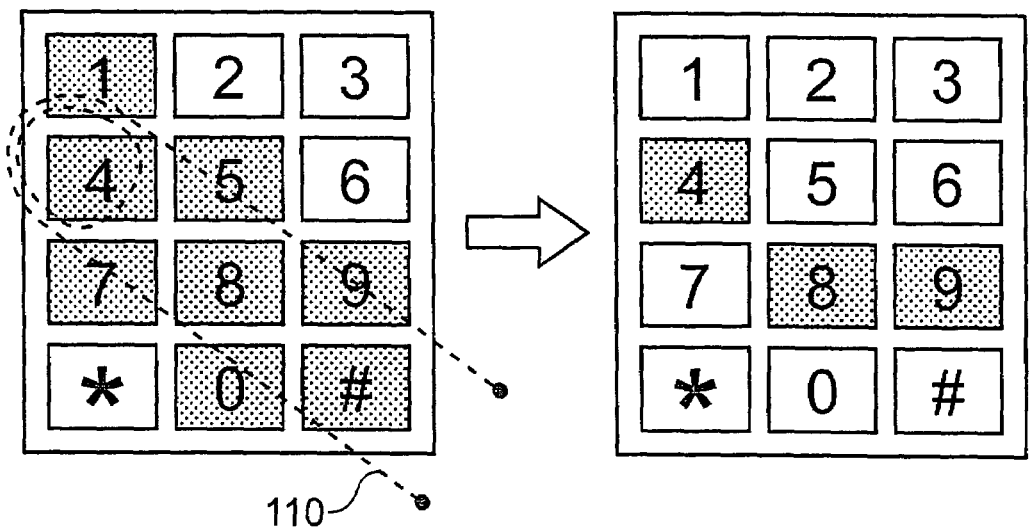
FIGS. 10A and 10B schematically demonstrate how a single key deemed to be an intended key for selection from a plurality of activated keys is determined in a user interface according to an embodiment of the invention.
Figure 10B:
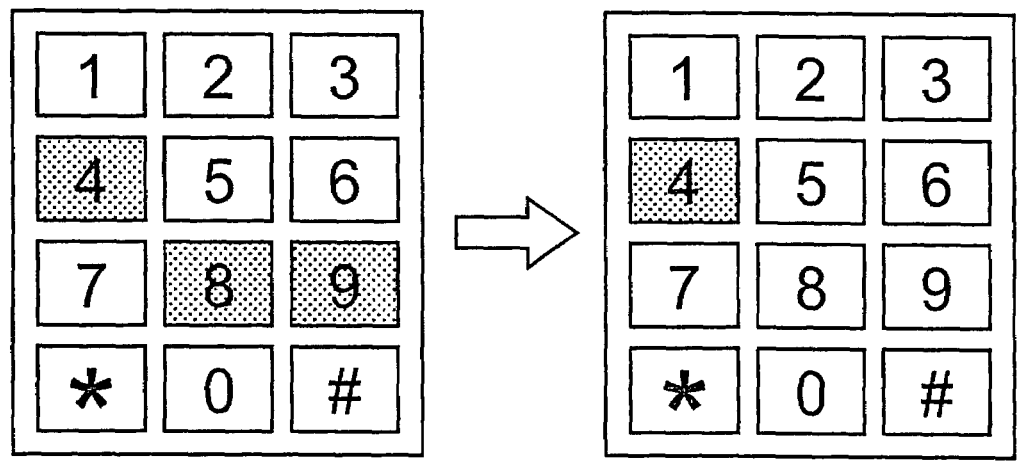

FIGS. 10A and 10B schematically show how a single key deemed to be an intended key for selection from a plurality of activated keys is determined in a user interface according to an embodiment of the invention using both CKS and PDS techniques according to an embodiment of the invention. Here it is assumed that the CKS aspects of the technique are applied in accordance with the predefined groupings shown in FIGS. 7 to 9 and the PDS aspects of the technique are applied in accordance with the priority ranking scheme shown in FIG. 4.

In FIG. 10A, the left-hand representation of the keypad schematically shows in plan view a user's finger 110 in a position in which the user intends to select key "4". Thus the user's finger tip is shown overlaying key "4". The user's finger approaches and extends along a direction from the lower-right of the keypad (for the orientation shown in the figure). This means that keys other than the intended key "4" show an increase in capacitive coupling. Those keys for which the characteristics of the increase in capacitive coupling associated with the presence of the user's finger is sufficient for the key to be deemed activated (e.g. as determined according to any conventional technique for determining this) are shown as shaded in the figure. In this example the keypad is relatively small compared to the user's finger such that the user's finger overlays, at least in part, the majority of the keys. Furthermore, in this example the keys are relatively sensitive (e.g. a relatively low change in output signal threshold has been set for deeming a key to be in detection). This could be the case because the keypad is intended to also be used with a pointing stylus and so needs to be sufficiently sensitive to respond to this. As a result of the small keypad and its relatively high sensitivity, the user's finger causes the majority of keys to be determined activated. Thus in this example, as shown in the left-hand side of FIG. 10A, keys "1", "2", "5", "7", "8", "9", "0" and "#" are all considered activated. An intended key for selection by the user from all of these keys is determined as follows according to this embodiment of the invention.

Firstly the key groupings shown in FIG. 6 are individually considered. This may be done in series or in parallel depending on the processing capabilities of the UI controller.

The first group of keys (containing "1", "4", "7" and "*") is considered here first. The UI processor is operable to compare the activated keys in this group (i.e. keys "1", "4" and "7") with the predefined key combinations for this group as shown in FIGS. 7A to 7C. Here the UI controller would identify a match with the predefined combination of keys shown in FIG. 7A. Accordingly, key "4" (as indicated in the left-hand side of FIG. 7A) would be determined to be a selected key from within the first group of keys.

The second group of keys (containing "2", "5", "8" and "0") is considered here next. The UI processor is operable to compare the activated keys in this group (i.e. keys "5", "8" and "0") with the predefined key combinations for this group as shown in FIGS. 8A to 8C. Here the UI controller would identify a match with the predefined combination of keys shown in FIG. 8B. Accordingly, key "8" (as indicated in the left-hand side of FIG. 8B) would be determined to be a selected key from within this group of keys.

Finally the third group of keys (containing "3", "6", "9" and "#") is considered. The UI processor is unable to match the activated keys in this group with any of the predefined key combinations for this group. This is because the keys in activation (keys "9" and "#") do not, in this embodiment, correspond to any of the predefined combinations shown in FIGS. 9A to 9C. The UI processor therefore reverts to the PDS scheme described above, based on the ranking scheme shown in FIG. 4, to distinguish between the activated keys within the group. Thus key "9" is determined to be a selected key from within this group of keys (because key "9" has a ranking of 9 whereas key "#" has a lower priority ranking of 12).

Thus at this stage of the processing by the UI controller the initially determined eight keys in activation for the current measurement acquisition cycle have been reduced to three selected keys, one from each group. These keys are "4", "8" and "9", as indicated by shading in the right-hand side of FIG. 10A.

The left-hand side of FIG. 10B corresponds with the right-hand side of FIG. 10A. The UI controller is configured to now select one of the three selected keys indicated in the left-hand side of FIG. 10B as the user intended key for the present measurement cycle. This may be done by selecting among the three selected keys according to the PDS ranking scheme shown in FIG. 4. Thus in this case key "4" is determined to be the user intended key because key "4" has a position-based priority ranking of 4 whereas keys "8" and "9" have lower priority rankings of 8 and 9 respectively.

Thus the UI controller of a UI implementing the above-described scheme is operable to determine key "4" as a user intended key from all of the keys "1", "2", "5", "7", "8", "9", "0" and "#" in detection during the measurement acquisition cycle schematically shown in the left-hand side of FIG. 10A.

Figure 11:
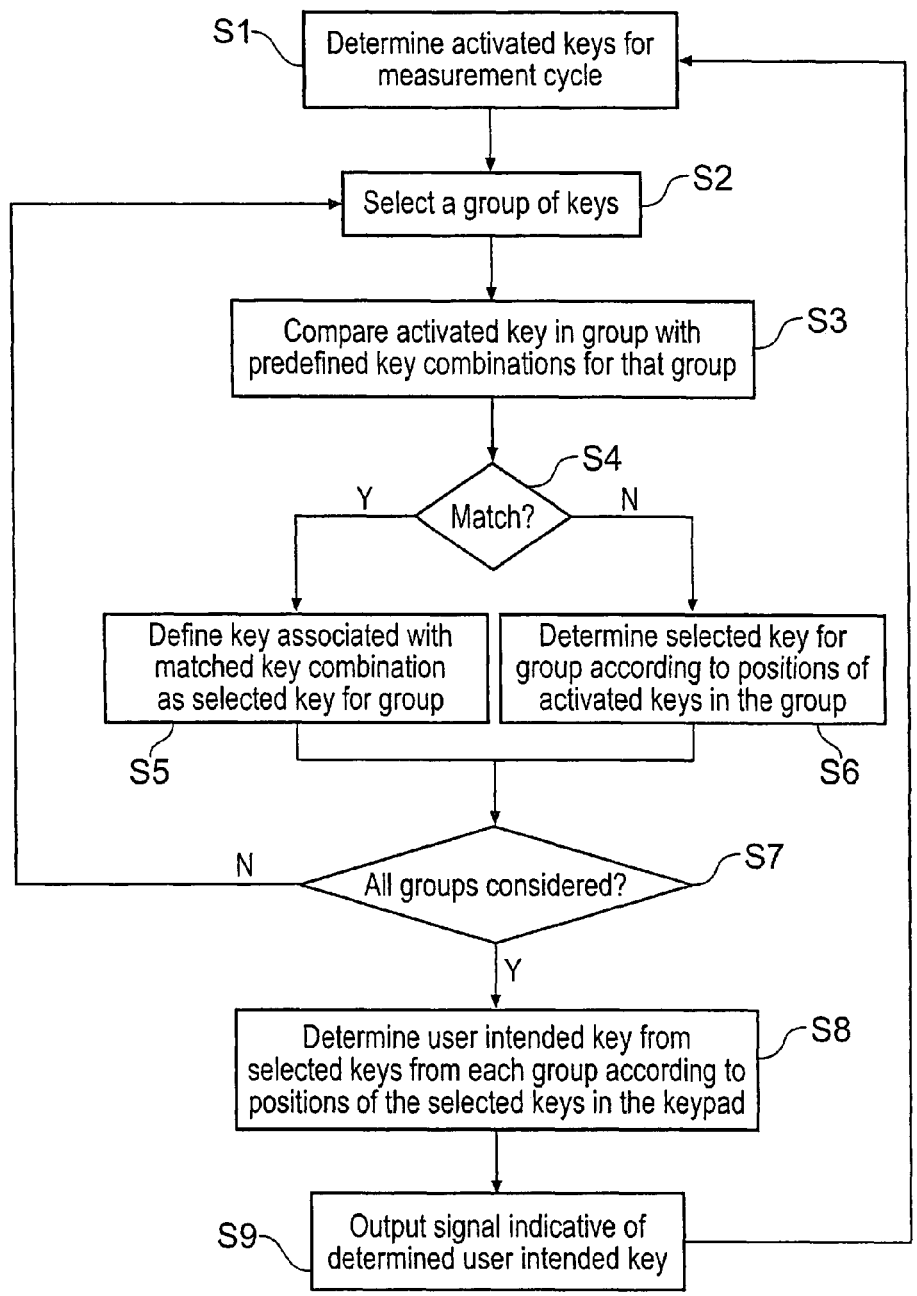
FIG. 11 is a flow diagram schematically showing steps for determining a user selected key from a plurality of activated key in a user interface of the kind shown in FIG. 1.

FIG. 11 is a flow diagram representing the above described steps for determining a user selected key from a plurality of activated key in a UI of the kind shown in FIG. 1 (with the UI controller appropriately configured to execute the method).

In Step S1, the UI controller determines which keys in the keypad are in detection (i.e. which are activated) for the current acquisition/measurement cycle. This may be done according to known techniques, e.g. based on requiring a keys output signal to exceed a predefined activation output signal level for at least a predefined duration for it to be considered activated. Techniques such as thresholding, drift compensation, filtering, etc. may be used.

In Step S2 a first group of keys within the keypad, e.g. one of the key groupings shown in FIG. 6, is selected for consideration.

In Step S3 the UI controller compares the activated keys in the group currently under consideration with the predefined key combinations for that group.

In Step S4 the UI controller determines whether or not there is a match between the combination of activated keys in the group currently under consideration and any of the predefined key combinations for that group based on the results of the comparison performed at step S3. If there is a match (correspondence), processing follows the branch marked "Y" to step S5. If there is a not a match, processing follows the branch marked "N" to step S6.

For the case there is a match at Step S4, in Step S5, the UI controller defines the key associated with the matched predefined key combination as a selected key from within the group currently being considered.

For the case there is not a match at Step S4, in Step S6, the UI controller determines a selected key from within the group currently being considered. This is done using the above-described PDS technique. In this example it is done in accordance with the priority ranking scheme shown in FIG. 4 (with only the keys in the current group being considered).

In Step S7 the UI controller determines whether all of the groups into which the keypad is notionally divided have been considered. If not, processing follows the branch marked "N" to return to Step S2 so as to repeat Steps S2 to S7 until all groups have been considered. Once all of the groups have been considered, processing follows the branch marked "Y" from Step S7 to Step S8.

The result of the processing up to Step S8 is thus a plurality of selected keys, i.e. one from each group (assuming all groups contain at least one activated key, if not, a selected key will not be determined in either of Steps S5 or S6 and a null result for that group will arise—i.e. no selected key determined for that group).

In Step S8 the UI controller determines a user intended key for the current acquisition/measurement cycle from among the keys determined to be the selected keys for the respective groups. This is done in this example using the above-described PDS technique in accordance with the priority ranking scheme shown in FIG. 4.

In Step S9 the UI controller outputs a signal indicating the user intended key determined at step S8. A main controller of the device/apparatus, e.g. mobile (cellular) telephone, in which the UI is incorporated receives the signal indicating the determined user intended key and takes appropriate action. E.g. the appropriate action may be including the number associated with the determined intended key in a telephone number being dialed, or instigating a menu option corresponding to the determined user intended key.

In this case the UI is configured to continuously make measurements, and thus following Step S9, processing returns to Step S1 for another iteration of data acquisition. In the event there are no keys which meet the requirement for being deemed activated in a given measurement/acquisition cycle (i.e. in the event that only null results are obtained after all groups have been considered), the controller is configured to report in Step S9 that the keyboard is not presently in use (i.e. no key selected).

It will be appreciated that the method shown in FIG. 11 can be modified in a number of ways. For example, the UI might be configured to process some or all groups in parallel rather that in series as set out in FIG. 11 by the loop from Step S7 to S2.

In some embodiments the notional division of the keypad into groups might not be used. I.e. the keypad might be considered as including only one group containing all keys in the keypad. Steps corresponding to Steps S2, S7 and S8 would then not be required, and the key determined/defined in either of Step S5 or S6 would be deemed the user intended key for the current measurement cycle.

Furthermore, different techniques could be used in Steps S6 and/or Step S8. E.g. PDS techniques based on other priority ranking schemes, such as shown in FIGS. 3 and 5, or non-PDS techniques such as known techniques based only on the output signals associated with the keys being considered (e.g. selecting which key has the greatest signal strength, signal duration, or earliest rising signal).

It will also be appreciated that the above described techniques can be applied to other UI layouts depending on the device/apparatus in which the UI is incorporated, and are not limited to a three-by-four array such as described above.

Figure 12A:
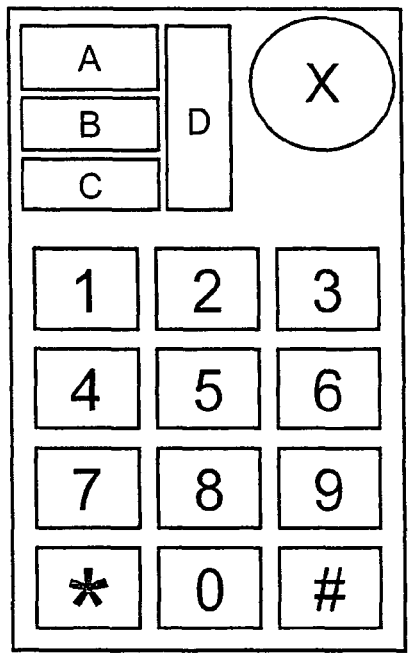
FIG. 12A schematically shows in plan view a touch sensitive user interface (UI) according to another embodiment of the invention.

For example, FIG. 12A schematically shows in plan view a touch sensitive user interface (UI) according to another embodiment of the invention. The UI includes additional keys to the UI shown in FIG. 1, but aspects of the UI are otherwise similar to, and will be understood from, the UI shown in FIG. 1 (with the controller being appropriately configured). The UI in FIG. 12A includes a numeric keypad section such as shown in FIG. 1, and additional keys marked "A", "B", "C", "D" and "X". The UI might for example be for use in a domestic cooker. The keys "A", "B", "C" and "D" might be associated with particular cooking programs, key "X" might be associated with a switch-off facility, and the numeric keypad may be used, for example, for inputting cooking times, with the "*" and "#" having ancillary functions, such as setting a delay time, or setting a temperature. The specific functions associated with the keys and the device/apparatus in which UI is implemented are not significant.

The keypad section of the UI may be notionally divided into three groups of keys such as shown in FIG. 6. The keys "A", "B", "C" and "D" may be considered as another group of keys. Key "X" may be considered a master key whereby if key "X" is in detection, it is taken to be the user-intended key, regardless of which other keys (if any) are also in detection. The approach of defining master key(s) such as this can help ensure safety related functions (e.g. switch-off) are easily recognized and activated, even if keys relating to other functions are also in detection.

A UI controller of the UI shown in FIG. 12A may be configured to determine a user selected key from a plurality of activated keys in a manner broadly similar to that shown in FIG. 11. However, there may be an additional step performed between steps corresponding to Step S1 and S2 of FIG. 11 which corresponds to determining if key "X" is in detection, and if so, jumping directly to a step corresponding to S9 in which key "X" is indicated as being the determined user selected key. This is to accommodate key "X" being a master key in this example.

Otherwise the UI controller may determine a user selected key from a plurality of activated keys broadly as described above. The primary difference compared to the above-described embodiment will be that there are four groups to cycle through Steps S2 to S7, rather than three. Furthermore, the additional keys "A", "B", "C" and "D" would have priority rankings associated with them for use in steps corresponding to Steps S6 and S8 of FIG. 11 (if PDS techniques are to be used for these steps). Furthermore still, predefined key combinations and associated deemed keys for selection would be defined for additional keys "A", "B", "C" and "D".

A position dependent ranking scheme for the additional keys for use in steps corresponding to Steps S6 and S8 might, for example, have all of keys "A", "B", "C" and "D" having a higher priority ranking than the keys in the numeric keypad section of the UI. Thus one of "A", "B", "C" and "D" will always be the key determined as the user intended key at step S8 if at least one of them is in detection. Furthermore, the keys within the group may be ranked so that if there is no match at Step S4, in Step S6 key "A" is selected in preference over any other key, key "B" is selected in preference over key "C" or key "D", and key "C" is selected in preference over key "D", and key "D" is selected only if it is the sole key in detection within the group.

Figure 12B:
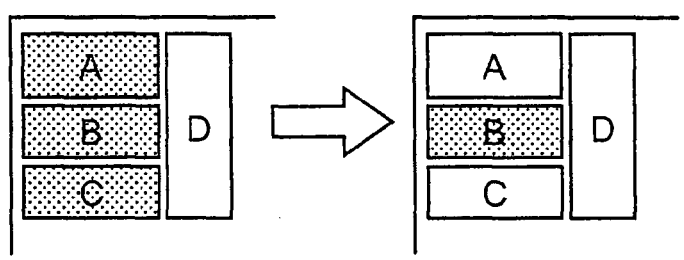
FIGS. 12B-12D schematically show a series of pre-defined key combinations and corresponding deemed user selected keys for some of the keys in the keypad of the UI shown in FIG. 12A.
Figure 12C:
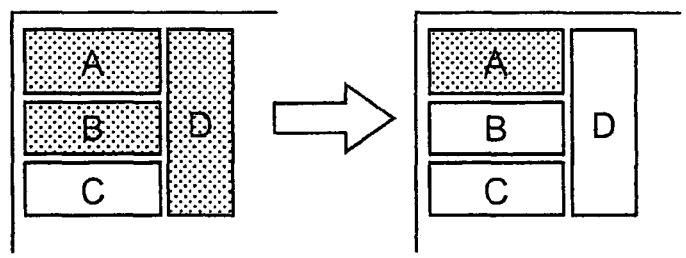
Figure 12D:
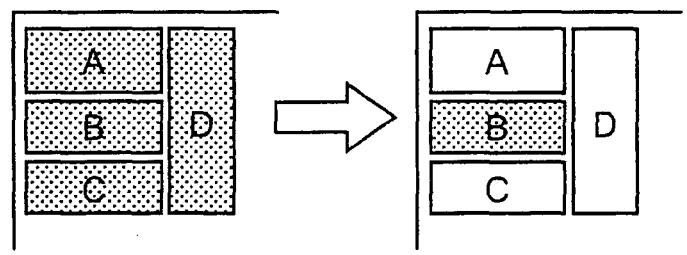

FIGS. 12B to 12D schematically show three different predefined key combinations associated with the group of keys "A", "B", "C" and "D", and also for each predefined combination of keys, a corresponding selected key deemed to be a selected key for that combination. Thus FIGS. 12B to 12D are similar to, and will be understood from, FIGS. 7 to 9.

Thus the left-hand of FIG. 12B shows a first predefined combination of keys corresponding to keys "A", "B" and "C" in detection and key "D" not in detection. The right-hand of FIG. 12B shows that key "B" is deemed to be the selected key corresponding to this combination. The left-hand of FIG. 12C shows a second predefined combination of keys corresponding to keys "A", "B" and "D" in detection and key "C" not in detection. The right-hand of FIG. 12C shows that key "A" is deemed to be the selected key corresponding to this combination. The left-hand of FIG. 12C shows a second predefined combination of keys corresponding to keys "A", "B" and "D" in detection and key "C" not in detection. The right-hand of FIG. 12C shows that key "A" is deemed to be the selected key corresponding to this combination. The left-hand of FIG. 12D shows a third predefined combination of keys corresponding to all keys within the group in detection. The right-hand of FIG. 12D shows that key "B" is deemed to be the selected key corresponding to this combination. Other combinations may also be defined which are not shown here for brevity, for example another predefined combination might correspond to keys "B", "C" and "D" in detection and key "A" not in detection. The predefined combinations and their associated deemed selected keys may be determined empirically as described above.

The preceding description, in particular with reference to FIG. 1, has focused on capacitive sensors based on what might be termed passive sensing techniques, i.e. sensors in which all of the electrodes defining the sensing areas in the sensing region are individually responsive to a capacitive coupling between a pointing object and respective ones of the sensing areas (i.e. sensors of the type described in U.S. Pat. No. 5,730,165 and U.S. Pat. No. 6,466,036). However, embodiments of the invention may also be based on what might be termed active capacitive sensing techniques, e.g. sensors in which sensitive areas are based on paired drive and receive electrodes such as described in U.S. Pat. No. 6,452, 514). The drive and receive electrodes may be arranged in a matrix array where keys (sensing areas) are defined by overlap regions between row and column electrodes. With this type of sensor, changes in a capacitive coupling between a pointing object and respective ones of the sensing areas modify the transfer of a drive signal from the drive electrode to the receive electrode.

Furthermore, although the above description has focused on user interfaces comprising physically discrete sensing areas, embodiments of the invention may be based on a user interface having a continuous 2-D sensing region in which "virtual" sensing areas are defined. For example, a continuous 2-D region may be notionally divided into an array of virtual discrete keys.

It will also be appreciated that position sensors embodying the invention may incorporate a variety of additional features. For example, in some applications it is desirable to have a 'wakeup' function, whereby the entire device 'sleeps' or is in some quiescent or background state. In such cases, it is often desirable to have a wake signal from mere proximity of a human body part some distance away. The element can be driven as a single large capacitive electrode without regard to position location, while the unit is in the background state. During this state the electronic driver logic looks for a very small change in signal, not necessarily enough to process as a 2D coordinate, but enough to determine that an object or human is in proximity. The electronics then 'wakes up' the overall system and the element is driven so as to become a true position sensor once again.

Also, although the term "touch" may be used in this description, a position sensor of the kind described above can be sufficiently sensitive that it is able to register the location of an adjacent finger (or other object such as a stylus) without requiring physical contact. The term "touch" as used herein should therefore be interpreted accordingly.

It will be appreciated that although particular embodiments of the invention have been described, many modifications/additions and/or substitutions may be made within the scope of the present invention. Accordingly, the particular examples described are intended to be illustrative only, and not limitative. Furthermore, it will be understood from the above description that features of embodiments of the invention may be combined in ways other than those explicitly set out in the appended claims.

Other Embodiments

In studying this description, the reader may be aided by noting definitions of certain words and phrases used throughout this patent document. Wherever those definitions are provided, those of ordinary skill in the art should understand that in many, if not most instances, such definitions apply to both preceding and following uses of such defined words and phrases. At the outset of this description, one may note that the terms "include" and "comprise," as well as derivatives thereof, mean inclusion without limitation; the term "or," is inclusive, meaning and/or. The word 'key' as generally used in this disclosure refers to a touchable portion of a mechanical to electrical transducing device that is non-bistable in nature. This term specifically excludes conventional mechanical switches in which two or more electrical conductors are moved into or away from contact with each other to make or break an electrical connection. The terms 'keyboard', 'keypad' and the like all refer to arrays of keys for data input without limitation as to the size or configuration of the array. A 'key' can also be a dimensional sensing surface such as an XY touch screen or a 'trackpad', or a sensing zone not intended for normal human data entry such as an object or body part sensor. 'Touch' can mean either human or mechanical contact or proximity to a key. 'User' can mean either a human or a mechanical object. A 'finger' can be, inter alia, a human finger, a mechanical finger or a stylus. 'Upper' key can mean a key in an upwardly spaced location with respect to another key on a keypad. 'Lower' key can mean a key in a downwardly spaced location with respect to another key on a keypad.

Capacitive sensors, unlike bistable electromechanical switches which are either open or closed, provide a signal that varies with the degree of touch or extent or coupling between a user's finger and a sensing element of a keyboard. Other non-bistable touch sensors, such as an array of piezoelectric sensors in which the output from a given sensor increases with increasing activation force, share many of the properties of capacitive keys. Thus, much of the subsequent disclosure should be understood as being relevant to non-capacitive keys that also provide an output signal responsive to a degree of coupling between the key and a user's finger, stylus, or other key-activating or pointing implement that is proximate the key.

Figure 13:
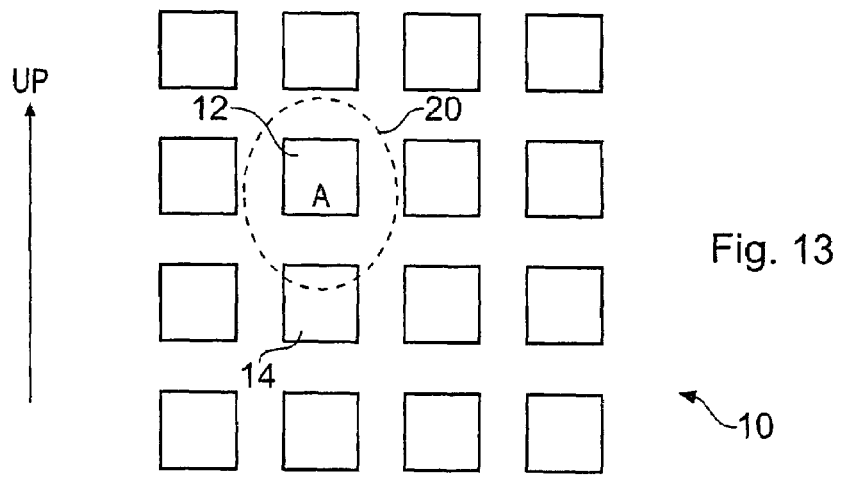
FIGS. 13 and 14 show an array of tightly spaced capacitive buttons.

Referring to FIG. 13, there is shown an array of 'N' tightly spaced capacitive keys in a key panel 10 which would benefit from the invention. When using such small key panels it is inevitable that a finger will encompass much more than the intended key. A finger touching a principle desired key electrode 12 could easily create a 'fingerprint' outline 20, as shown in dashed lines, where the fingerprint has a centroid location A. This fingerprint also encompasses key 14 other than the intended key. The amount of intersecting surface area between the dashed line and each key area is a reasonable representation of the amount of signal level change each intersected key will receive due to the touch, although even non-touched keys will also see an increase in signal due to mere finger proximity and to fringe-field effects within the touch panel.

In this case, the desire is to select the one and only one key which is intended by the user while suppressing outputs from adjacent keys intersected by the fingerprint. In this 'position-dependent' key suppression invention, the output signal from upper key 12 is favoured over the signal from lower key 14, albeit in this case that the signal from key 12 is stronger than that from key 14.

Figure 14:
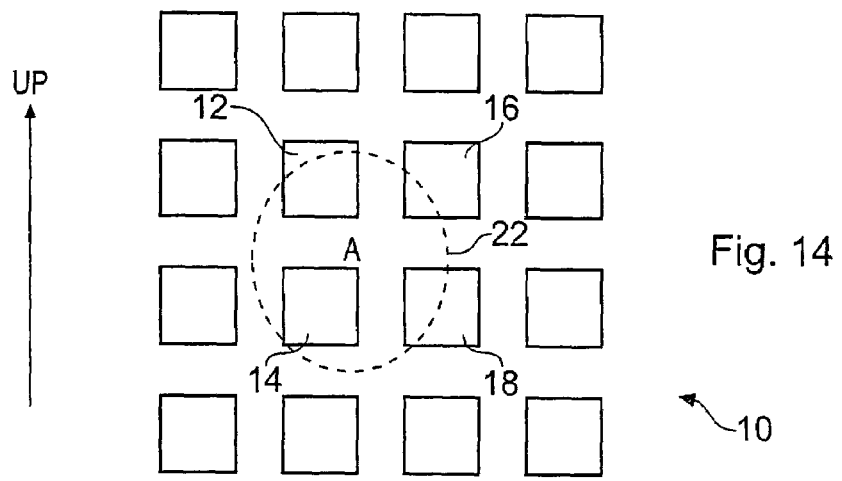
Figure 15A:
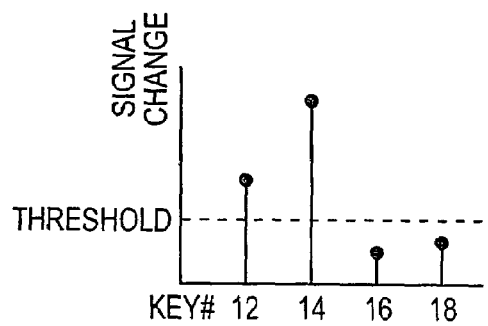
FIGS. 15(*a*) and 15(*b*) are graphical representations of signal magnitude associated with respective keys shown in FIG. 14 caused by capacitive coupling with a finger.
Figure 15B:
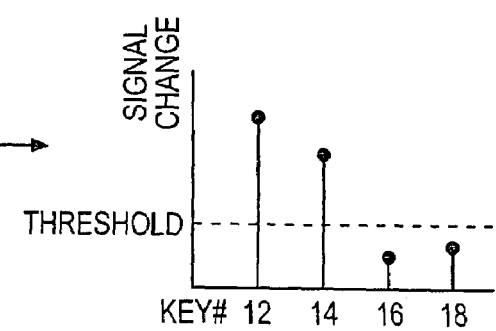

Referring to FIGS. 14 and 15, there is shown an array of capacitive keys in a key panel 10 in which a fingerprint represented by outline 22 (in dashed lines) encompasses four different keys 12, 14, 16, 18. The user's fingerprint 22 has a centroid location A which is just above key 14 and between keys 12,14. An output signal is measured from each of keys 12, 14, 16, 18, but the signal from key 14 has the maximum strength because the fingerprint outline 22 encompasses the whole of key 14. As shown in FIG. 15(a), the signal from each of keys 12 and 14 is above a threshold value. Key 14 would initially be the favoured key. However, as shown in FIG. 15(b) in accordance with the invention, the output signal from key 14 is suppressed and the output signal from key 12 is enhanced, so that the upper key 12 'wins' and becomes the user-selected key. In the invention, the signals from keys 14, 16, 18 can be suppressed and/or the signal from key 12 can be enhanced. Therefore, the invention allows an upper key (key 12 in FIG. 14) having a weaker signal to become dominant with respect to a lower key (key 14 in FIG. 14) having a stronger signal, even if the measured signal from key 12 is below a threshold value. Signal enhancement can be directed to the 'intended' key 12 due to the upper position of the key in the region of keys that are touched. An algorithm may be executed by a controller to enhance or activate the measured signal from key 12. In an alternative embodiment, the keypad comprising an array of capacitive keys may be in the form of a capacitive touch screen or touch pad.

Figure 16:
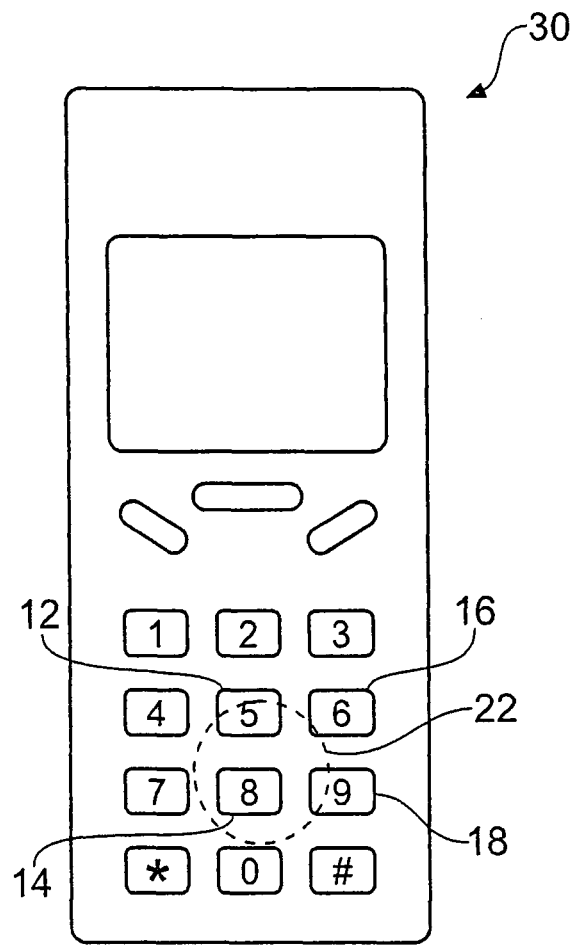
FIG. 16 schematically shows a mobile phone handset having an array of tightly spaced capacitive buttons.

Referring to FIG. 16, there is shown a mobile phone handset 30 comprising an array of capacitive keys in a key panel similar to that shown in FIG. 14. The corresponding features in FIG. 16 have the same reference numerals as those in FIG. 14. The output signal from key 12 (representing no. 5 on the key panel) is enhanced with respect to the signal from key 14 (representing no. 8 on the key panel) so that key 12 becomes the user-selected key. The invention is particularly useful where a user inadvertently touches keys 14 and 18, despite wishing to press the intended key 12.

Figure 17:
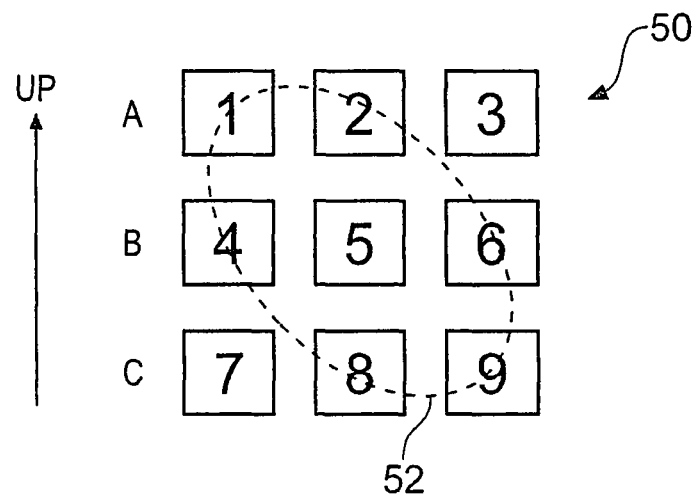
FIG. 17 schematically shows a keypad of a mobile phone handset.

Referring to FIG. 17, there is shown an array of closely spaced capacitive keys in a key panel 50 which may form part of a mobile phone handset. The keys of the key panel 50 represent numerals 1 to 9. Keys 1, 2 and 3 are located on an upper level designated A of the key panel 50; keys 4, 5 and 6 are located on a middle level designated B; and keys 7, 8 and 9 are located on a lower level designated C of the key panel. A fingerprint represented by outline 52 (in dashed lines) encompasses 7 different keys 1, 2, 4, 5, 6, 8, 9. The user's fingerprint 52 has a centroid location which is on key number 5. The amount of intersecting surface area between the dashed line and each key area is a reasonable representation of the amount of signal level change each intersected key will receive due to the touch. Often when a user's finger approaches an intended key to be selected, the finger is at an angle to the keys on the key panel. The finger outline 52 illustrates a touch on the key panel 50 which is at an angle to the keys as the finger (not shown) touches the key panel. The intended key to be selected by the user is key number 1 on upper level A. The tip of the finger touches key 1, however the fingerprint also encompasses keys 2, 4, 5, 6, 8 and 9. The output signal from key 5 has the maximum signal strength. The signals from keys 1, 2, 4 and 8 are above a threshold value. Key 5 would initially be the favoured key as it has the highest signal strength, but in accordance with the invention keys 1 and 2 on the upper level A are selected by enhancing their signal strength and suppressing the signals from keys 4, 5, 6, 8 and 9. The invention preferentially selects an upper key based on its position in relation to other keys and based on the angle of touch by a person's finger.

In this case, the output signal from each of keys 1 and 2 caused by capacitive coupling with a user's finger is above a threshold value and of substantially the same strength. An algorithm may be executed by a controller to ignore the signals from keys 1 and 2 until the user moves his finger away from key 2 to the intended key 1 so that the signal from key 2 is reduced.

If a user touches two keys on the same level of the key panel, for example keys 7 and 8 on lower level C, then the DI system disclosed in U.S. Ser. No. 11/279,402 (published as US 2006-0192690 A1) may be used to select the desired key.

In an alternative embodiment, the output signal from the intended key 1 may not need to be enhanced to make it the user-selected key. An algorithm executed by a controller may be able to process the signals from keys 1, 2, 4, 5, 6, 8 and 9 and make key 1 the user-selected key based on the vector of touch illustrated in FIG. 17. An algorithm can be arranged to process different vectors of touch so as to determine the user-selected key, in this case the key 1 on upper level A.

There are, of course, many possible variations and extensions of the procedure. For example, one may consider a rare case in which a user brings his or her finger up to a keyboard so that the point of touch is exactly between two keys. In this case, one could modify the depicted process to either select just one of those keys (e.g., by means of a known pseudo-random number selection algorithm, or by sample sequence order) or by suppressing the output of both keys until the user move his or her finger enough that one of the two keys had a higher output than the other.

Thus, it will be understood that in more of the applications with capacitive keys it is possible apply some restrictions in keys in detection that depend on the physical design of the keyboard. One universal restriction is the AKS technique which provides that the key with the strongest signal wins. But when using only AKS on very small keyboards (like mobile phones) it is possible to observe some wrong behavior because of the "hand shadow" effect and different sensitivity of the keys. The hand shadow effect shifts the maximum of the signal in one or other direction that results in wrong reporting of the key press. For example in FIG. 18 the finger touches the bottom of Key1 it also induces some signal into Key4. Because of the hand shadow effect Key4 could have a stronger signal and could win the AKS competition. In addition, if the sensitivity of the keys is not equal (and practically this is always the case) the key with higher sensitivity (bigger change of the signal) can completely suppress in AKS technique the small next-door keys ("disappearing" of a key).

One solution to the problem is to take in mind the physical design of the keyboard and when several keys are going simultaneously in detection to suppress some of them.

Figure 18:
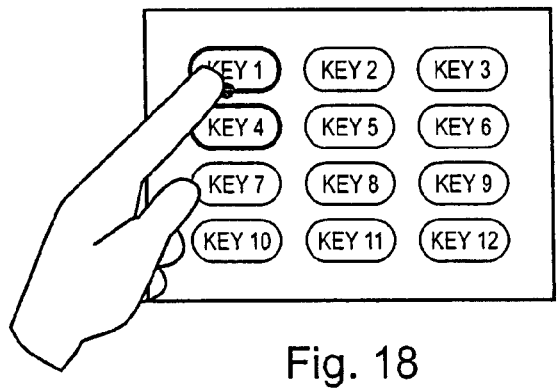
FIG. 18 schematically shows a keypad with two keys simultaneously in detection.

If we have, for example, two keys in detection like in FIG. 18 (Key1 and Key4) and if we know that Key1 is north (i.e., towards the upper side in the depiction of the drawing) of the keyboard we can suppress Key4 and report only Key1. Here the AKS technique on a small keyboard will not work correctly—Key4 because of the hand shadow effect will gain sensitivity.

One solution to the problem is to implement priorities between the keys, which could be set according to the physical design of the keyboard. Knowing the normal touch direction (every keyboard has some orientation) we can assign to some keys higher priority than others and they will go in detection even if they don't have the biggest signal (but they still have signal for detection). On the keys with the same priority we can apply the standard AKS technique—the key with the strongest signal wins.

Figure 19:
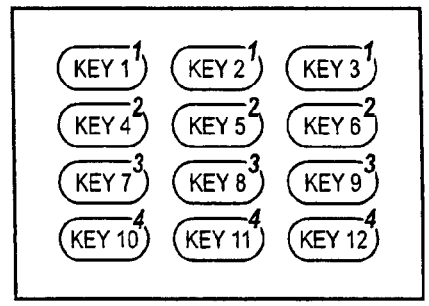
FIG. 19 schematically shows a keypad in which keys on the top row have higher priority.

In FIG. 19 is shown how we can assign priorities on a standard keyboard—keys on top have always higher priority than the keys on bottom (low number means higher priority).

For mobile phone keyboards the thumb can cover the whole keyboard to press the key on the opposite side. In such case the configuration of key priorities in FIG. 19 will not work properly and is better to use one shown in FIG. 3.

Figure 20:
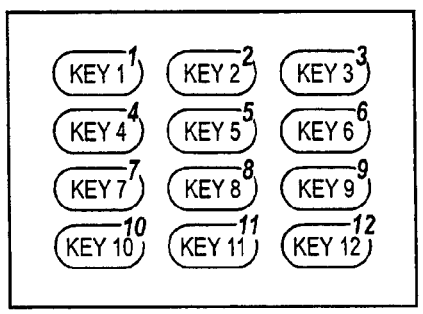
FIG. 20 schematically shows a mobile telephone keypad in which keys are prioritized for use by a right-handed user.

In FIG. 20 is shown how we can assign priorities to the keys on a mobile phones keyboard. Left side keys have higher priority than right side keys and top keys have higher priority than keys on the bottom. Note that this configuration works pretty well for right handed people, but could fail in some circumstances for left handed people.

Figure 21:
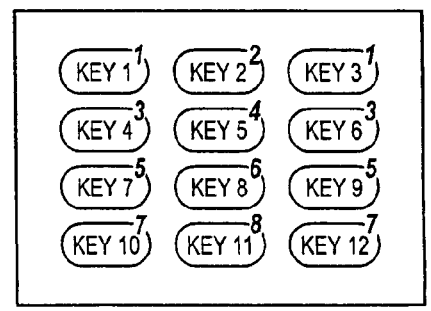
FIG. 21 schematically shows a mobile telephone keypad in which keys are prioritized for use by both left and right-handed users.

In FIG. 21 is shown one solution that brings equal key suppression for right and left handed people—the keys that are in the middle have lower priority than left and right keys and we still have top keys with higher priority than bottom ones.

Figure 22:
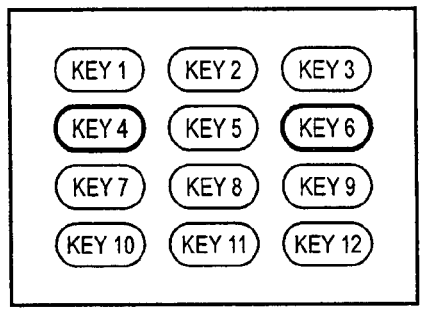
FIGS. 22 and 23 schematically shows a mobile telephone keypad employing combination key suppression.

Additional improvement could be reached if we look for particular key combinations (CKS—Combination Key Suppression). The idea is that priority suppression works well if we have 2 keys in detection, but for 3 and more keys simultaneously in detection in some cases fails. If we find one of the combinations we can report a specific key—for example in FIG. 22 if we see Key1, Key4 and Key7 simultaneously in detection we can report Key4 and if we see Key3, Key6, Key9 and Key12 in detection we can report Key6.

In case of Key1, Key4 and Key7 when we see all 3 keys in detection we can assume that the touch position is over the center of the touch area—i.e., Key4. To be more precise the hand shadow effect will move this point slightly in Key1 direction, but it will be still in Key4 area.

In case of Key3, Key6, Key9 and Key12 when all 4 keys are in detection the center of the touch area is between key6 and Key9, but because of the hand shadow effect it will move north to Key6 (hand shadow effect is always "pulling" down the calculated positions, so the real touch position should be considered always higher than the center of the touch area).

Combination key suppression (CKS) may be used only in these cases with multiple keys in detection, where priority key suppression may fail. Practically for the keyboard shown in FIG. 22 we may need 6 combinations.

Figure 23:
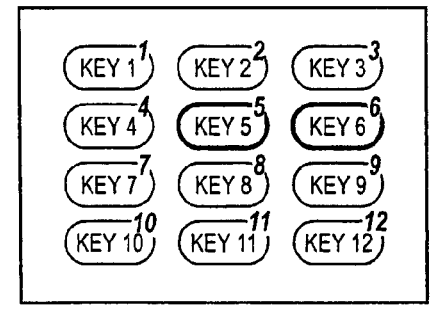

It is important when and how CKS is applied—for the best results this should be always before PKS and AKS. When we find one of the combinations we replace it with the response combination without affecting the keys outside of the combination. For example in FIG. 23 we find combination Key2, Key5 and Key8—it eliminates Key2 and Key8 and Key5 stays, but does not affect detected Key3, Key6, Key9 and Key12. We find also the other combination—Key3, Key6, Key9 and Key12 where only Key6 is not eliminated. Like result after applying CKS we can see only Key5 and Key6 in detection and because Key5 has higher priority after applying PKS the selected key is determined—Key5.

The implementation of CKS, PKS and AKS into embedded systems may require some special care to optimize the ROM/RAM usage.

The algorithm has been implemented by the inventors into a keyboard for a mobile phone and improved significantly the reliability of key detection. By using the standard AKS technique from 200 key presses the error rate was >30% (particularly in some areas was even higher) and some keys in the middle were strongly affected and suppressed from the next door ones. By implementing the PKS and CKS (with switched off AKS on all keys) the error rate was under 0.5%.

From the practice was found that if 4 sequential keys in one column are simultaneously in detection, the best match for the detected key may not be the top one, but the second from top to bottom.

The implementation of PKS and CKS can dramatically improve the reliability of key detection if the priorities and the code patterns are defined properly.

The priority is defined by the position of the key on the "priority tree" and especially from the priority of the node to which it is attached—lower number of the node mean higher priority. Knowing the priority tree helps us to optimize and organize the node priority numbers and for sure in simple cases we don't need to draw such tree.

Figure 24:
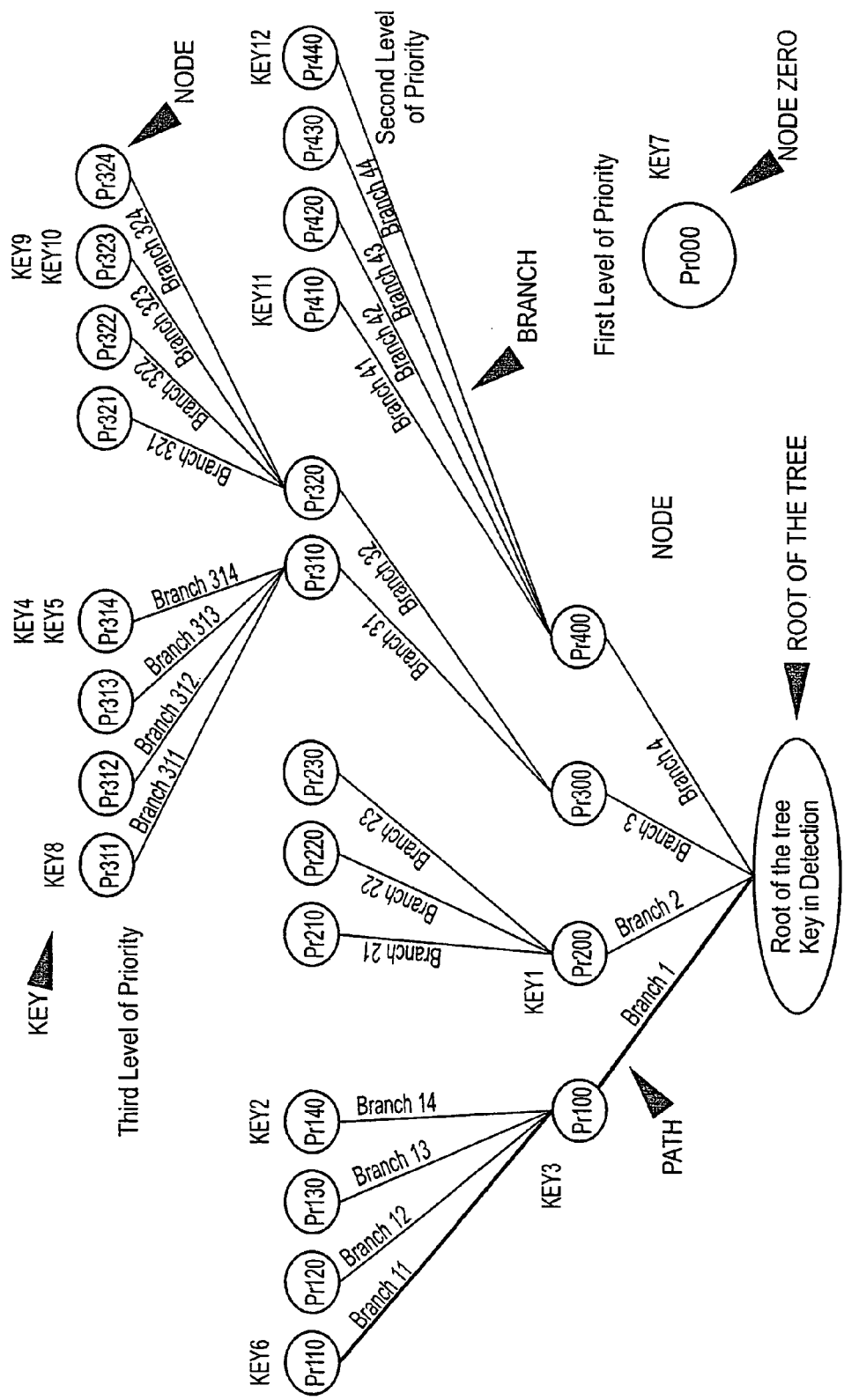
FIG. 24 schematically shows a priority tree for selecting a key.

We can define multiple levels of priority (in FIG. 24 are shown 3 different levels). Branches are the connections between the priority levels. Nodes are the places where are joining one or more branches. End nodes have only one branch connection (for example node 324). Each node has unique priority number. Parent node is the first node we see in direction to the root. The path is the trajectory from a key to the root of the priority tree.

The whole process of suppression of the keys is extremely simple—initially a digit is assigned to every node that represents the priority of the node. If two keys become simultaneously in detection we just compare the node numbers of the keys and the key with lowest node number wins. In case both keys are attached to the same node the standard AKS technique may be applied—the key with strongest signal wins. Lower number of the nodes means higher priority. The calculation of the winning key requires several iteration to eliminate low priority keys—one iteration for each priority level.

The main rules that solve the priority in case when two or more keys become simultaneously in detection is:

1. If several keys are simultaneously in detection the key attached to the node with lowest number wins (lowest number means highest priority between these keys). Example: Let us assume that Key3, Key2, Key6 and Key11 simultaneously go in detection. Because Key3 is attached to node Pr100 it will win over Key2, Key6 and Key11.
2. Key attached to node with priority ZERO is not included in the priority suppression calculations, i.e. priority ZERO is equal to disable the suppression process. So, all keys that we want to be excluded from the priority suppression calculations should be attached to node Zero. Example: Key 7 is attached to node ZERO and so it will not affect other keys and they cannot affect Key 7.

Although the above description has focused on capacitive sensing technologies, embodiments of the invention may be based on other coupling mechanisms, e.g. magnetic coupling mechanisms. For example, the sensing areas may be provided by magnetic field sensors and a pointing object may be magnetized do that the magnetic field sensors are sensitive to its proximity. Other non-contact coupling mechanisms could also be used.

Thus apparatus and methods are described for selecting which of a plurality of simultaneously activated keys in a keyboard based on an array of capacitive sensors is a key intended for selection by a user. Combinations of keys which are commonly activated simultaneously when a user intends to select a single key are identified and associated with the single keys most likely to give rise to the identified combinations during normal use of the keyboard. In use, an observed combination of simultaneously activated keys is compared with predefined combinations of keys corresponding to those identified as being commonly activated simultaneously. If the combination of activated keys matches one of the predefined combinations, the most likely intended key associated with the matched one of the predefined combination of keys is taken to be most likely intended key.

What is claimed is:

1. An apparatus comprising:
   a touch-sensitive interface that comprises a plurality of sensing areas within a sensing region; and
   one or more computer-readable non-transitory storage media coupled to the touch-sensitive interface that embody logic operable when executed to:
   receive a first set of signals, the first set of signals comprising two or more output signals responsive to two or more substantially contemporaneous capacitive couplings, each of the substantially contemporaneous capacitive couplings occurring between a pointing object and one of the plurality of sensing areas within the sensing region of the touch-sensitive interface; and
   select, when the sensing areas corresponding to the substantially contemporaneous capacitive couplings do not constitute one of a plurality of predefined combinations of one or more of the sensing areas, each predefined combination having a preselected sensing area of the plurality of sensing areas, one of the sensing areas corresponding to the substantially contemporaneous capacitive couplings based at least in part on scaled output signals of the first set of signals, wherein each of the output signals is scaled by a predetermined scale factor associated with a priority rank of the one of the plurality of sensing areas corresponding to the substantially contemporaneous capacitive coupling to which the output signal corresponds.

2. The apparatus of claim 1, wherein a particular predefined combination of the plurality of predefined combinations comprises sensing areas beyond sensing areas neighboring the preselected sensing area of the particular predefined combination.

3. The apparatus of claim 1, wherein a particular predefined combination of the plurality of predefined combinations comprises four sensing areas.

4. The apparatus of claim 1, wherein a particular predefined combination of the plurality of predefined combinations comprises three sensing areas arranged along a line and the preselected sensing area for the particular predefined combination is a middle one of the three sensing areas along the line.

5. The apparatus of claim 4, wherein the line corresponds with a direction of approach or extent of a pointing object during normal use.

6. The apparatus of claim 1, wherein a particular predefined combination of the plurality of predefined combinations comprises four sensing areas arranged along a line and the preselected sensing area for the particular predefined combination is located at an end of the line.

7. The apparatus of claim 6, wherein the line corresponds with a direction of approach or extent of a pointing object during normal use, and the preselected sensing area for the particular predefined combination is a second most distant one of the four sensing areas along the line relative to the direction of approach or extent of the pointing object during normal use.

8. The apparatus of claim 1, wherein a particular predefined combination of the plurality of predefined combinations comprises a contiguous series of neighboring sensing areas.

9. The apparatus of claim 1, wherein a particular predefined combination of the plurality of predefined combinations comprises at least three sensing areas.

10. The apparatus of claim 1, the logic further operable when executed to:
    receive a second set of signals, the second set of signals comprising two or more output signals responsive to two or more substantially contemporaneous capacitive couplings, each of the substantially contemporaneous capacitive couplings occurring between a pointing object and one of the plurality of sensing areas within the sensing region of the touch-sensitive interface; and
    select, when the sensing areas corresponding to the substantially contemporaneous capacitive couplings constitute a particular predefined combination of the plurality of predefined combinations, the preselected sensing area of the particular predefined combination.

11. A method comprising:
    receiving a first set of signals, the first set of signals comprising two or more output signals responsive to two or more substantially contemporaneous capacitive couplings, each of the substantially contemporaneous capacitive couplings occurring between a pointing object and one of a plurality of sensing areas within a sensing region of a touch-sensitive interface; and
    selecting, when the sensing areas corresponding to the substantially contemporaneous capacitive couplings do not constitute one of a plurality of predefined combinations of one or more of the sensing areas, each predefined combination having a preselected sensing area of the plurality of sensing areas, one of the sensing areas corresponding to the substantially contemporaneous capacitive couplings based at least in part on scaled output signals of the first set of signals, wherein each of the output signals is scaled by a predetermined scale factor associated with a priority rank of the one of the plurality of sensing areas corresponding to the substantially contemporaneous capacitive coupling to which the output signal corresponds.

12. The method of claim 11, wherein a particular predefined combination of the plurality of predefined combinations comprises sensing areas beyond sensing areas neighboring the preselected sensing area of the particular predefined combination.

13. The method of claim 11, wherein a particular predefined combination of the plurality of predefined combinations comprises a contiguous series of neighboring sensing areas.

14. The method of claim 11, wherein a particular predefined combination of the plurality of predefined combinations comprises three sensing areas arranged along a line and the preselected sensing area for the particular predefined combination is a middle one of the three sensing areas along the line.

15. The method of claim 14, wherein the line corresponds with a direction of approach or extent of a pointing object during normal use.

16. The method of claim 11, further comprising:
    receiving a second set of signals, the second set of signals comprising two or more output signals responsive to two or more substantially contemporaneous capacitive couplings, each of the substantially contemporaneous capacitive couplings occurring between a pointing object and one of a plurality of sensing areas within a sensing region of a touch-sensitive interface; and
    selecting, when the sensing areas corresponding to the substantially contemporaneous capacitive couplings constitute a particular predefined combination of a plurality of predefined combinations of one or more of the sensing areas, each predefined combination having a preselected sensing area, the preselected sensing area of the particular predefined combination.

17. A computer-readable non-transitory storage media embodying logic that is operable when executed to:
receive a first set of signals, the first set of signals comprising two or more output signals responsive to two or more substantially contemporaneous capacitive couplings, each of the substantially contemporaneous capacitive couplings occurring between a pointing object and one of a plurality of sensing areas within a sensing region of a touch-sensitive interface; and
select, when the sensing areas corresponding to the substantially contemporaneous capacitive couplings do not constitute one of a plurality of predefined combinations of one or more of the sensing areas, each predefined combination having a preselected sensing area, one of the sensing areas corresponding to the substantially contemporaneous capacitive couplings based at least in part on scaled output signals of the first set of signals, wherein each of the output signals is scaled by a predetermined scale factor associated with a priority rank of the one of the plurality of sensing areas corresponding to the substantially contemporaneous capacitive coupling to which the output signal corresponds.

18. The media of claim 17, wherein a particular predefined combination of the plurality of predefined combinations comprises sensing areas beyond sensing areas neighboring the preselected sensing area of the particular predefined combination.

19. The media of claim 17, wherein a particular predefined combination of the plurality of predefined combinations comprises a contiguous series of neighboring sensing areas.

20. The media of claim 17, wherein a particular predefined combination of the plurality of predefined combinations comprises three sensing areas arranged along a line and the preselected sensing area for the particular predefined combination is a middle one of the three sensing areas along the line.

21. The media of claim 20, wherein the line corresponds with a direction of approach or extent of a pointing object during normal use.

22. The media of claim 17, the logic further operable when executed to:
receive a second set of signals, the second set of signals comprising two or more output signals responsive to two or more substantially contemporaneous capacitive couplings, each of the substantially contemporaneous capacitive couplings occurring between a pointing object and one of the plurality of sensing areas within the sensing region of the touch-sensitive interface; and
select, when the sensing areas corresponding to the substantially contemporaneous capacitive couplings constitute a particular predefined combination of a plurality of predefined combinations of one or more of the sensing areas, each predefined combination having a preselected sensing area, the preselected sensing area of the particular predefined combination.

* * * * *